United States Patent
Dube

(10) Patent No.: US 8,621,813 B2
(45) Date of Patent: Jan. 7, 2014

(54) WIRELESS SOLAR SHINGLE PANEL AND A METHOD FOR IMPLEMENTING SAME

(76) Inventor: Paul Dube, New London, CT (US)

(*) Notice: Subject to any disclaimer, the term of this patent is extended or adjusted under 35 U.S.C. 154(b) by 707 days.

(21) Appl. No.: 12/586,768

(22) Filed: Sep. 28, 2009

(65) Prior Publication Data

US 2010/0223864 A1   Sep. 9, 2010

Related U.S. Application Data

(60) Provisional application No. 61/209,368, filed on Mar. 6, 2009.

(51) Int. Cl.
*E04D 1/00* (2006.01)
*E04D 13/18* (2006.01)

(52) U.S. Cl.
USPC ............................. 52/518; 52/173.3; 136/252

(58) Field of Classification Search
USPC ......... 52/173.3, 518; 136/243, 244, 251, 252, 136/293, 265
IPC ......................................................... E04D 1/00
See application file for complete search history.

(56) References Cited

U.S. PATENT DOCUMENTS

| | | | |
|---|---|---|---|
| 4,040,867 A * | 8/1977 | Forestieri et al. | 136/244 |
| 6,111,189 A | 8/2000 | Garvison et al. | |
| 6,441,297 B1 | 8/2002 | Keller et al. | |
| 6,465,724 B1 | 10/2002 | Garvison et al. | |
| 7,465,873 B2 | 12/2008 | Nomura et al. | |
| 7,509,775 B2 | 3/2009 | Flaherty et al. | |
| 8,003,882 B2 * | 8/2011 | Pisklak et al. | 136/251 |
| 2002/0134421 A1 * | 9/2002 | Nagao et al. | 136/244 |
| 2005/0012021 A1 | 1/2005 | Middelman et al. | |
| 2005/0102947 A1 | 5/2005 | McCaskell et al. | |
| 2005/0178429 A1 | 8/2005 | McCaskell et al. | |
| 2005/0178430 A1 | 8/2005 | McCaskell et al. | |
| 2006/0032527 A1 | 2/2006 | Stevens et al. | |
| 2006/0266405 A1 * | 11/2006 | Lenox | 136/244 |
| 2007/0012352 A1 * | 1/2007 | Wohlgemuth et al. | 136/251 |
| 2007/0012353 A1 | 1/2007 | Fischer et al. | |
| 2007/0157963 A1 | 7/2007 | Metten et al. | |
| 2008/0105291 A1 * | 5/2008 | Pisklak et al. | 136/244 |
| 2008/0264474 A1 | 10/2008 | Frauenknecht et al. | |
| 2009/0014058 A1 | 1/2009 | Croft et al. | |

(Continued)

FOREIGN PATENT DOCUMENTS

| | | | | |
|---|---|---|---|---|
| JP | 62042465 A | * | 2/1987 | H01L 31/04 |
| JP | 03137345 A | * | 6/1991 | E04D 1/22 |
| JP | 06248761 A | * | 9/1994 | E04D 1/30 |

*Primary Examiner* — Brian Glessner
*Assistant Examiner* — Joseph J Sadlon
(74) *Attorney, Agent, or Firm* — Steven M. McHugh; TCORS

(57) ABSTRACT

A shingle and method is provided, wherein the shingle includes a shingle back having at least one back conductive trace and a shingle front configured to securely include at least one solar cell. The shingle front includes at least one front conductive trace configurable such that when the shingle front includes a solar cell, the solar cell is conductively connected to the at least one front conductive trace in a series fashion. At least one of the back conductive traces is conductively connected to at least one of the front conductive traces. The back conductive traces and the front conductive traces are configured such that when the shingle is associated with a like shingle, the back conductive trace of the like shingle is conductively connected to the at least one front conductive trace of the shingle to be in a series fashion.

20 Claims, 29 Drawing Sheets

(56) References Cited

U.S. PATENT DOCUMENTS

| | | |
|---|---|---|
| 2009/0120484 A1 | 5/2009 | Nightingale |
| 2009/0133739 A1* | 5/2009 | Shiao et al. ............ 136/251 |
| 2009/0133740 A1* | 5/2009 | Shiao et al. ............ 136/251 |
| 2009/0288702 A1* | 11/2009 | Kim et al. ............ 136/251 |
| 2010/0043319 A1* | 2/2010 | Bennett ............ 52/173.3 |

* cited by examiner

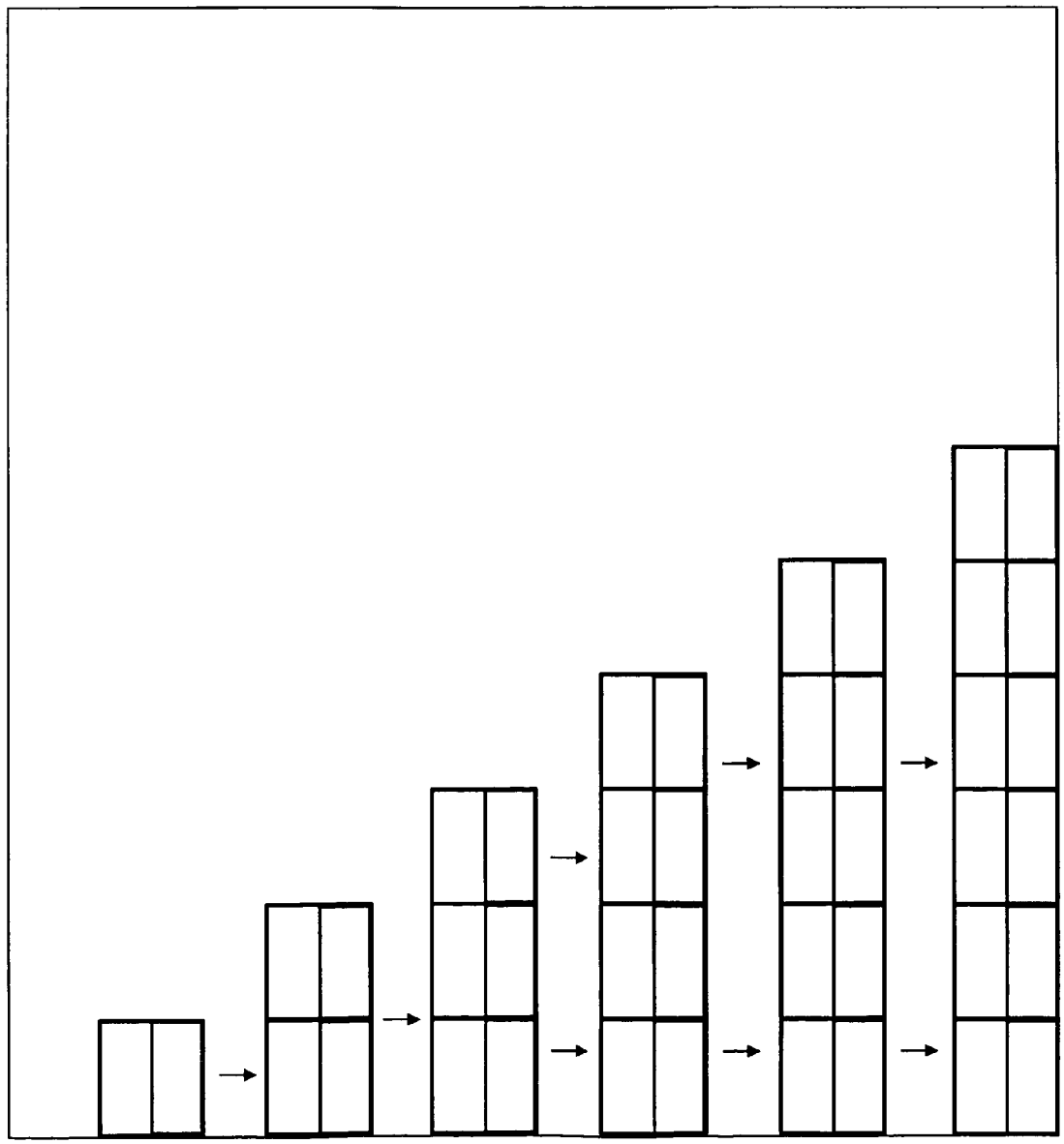

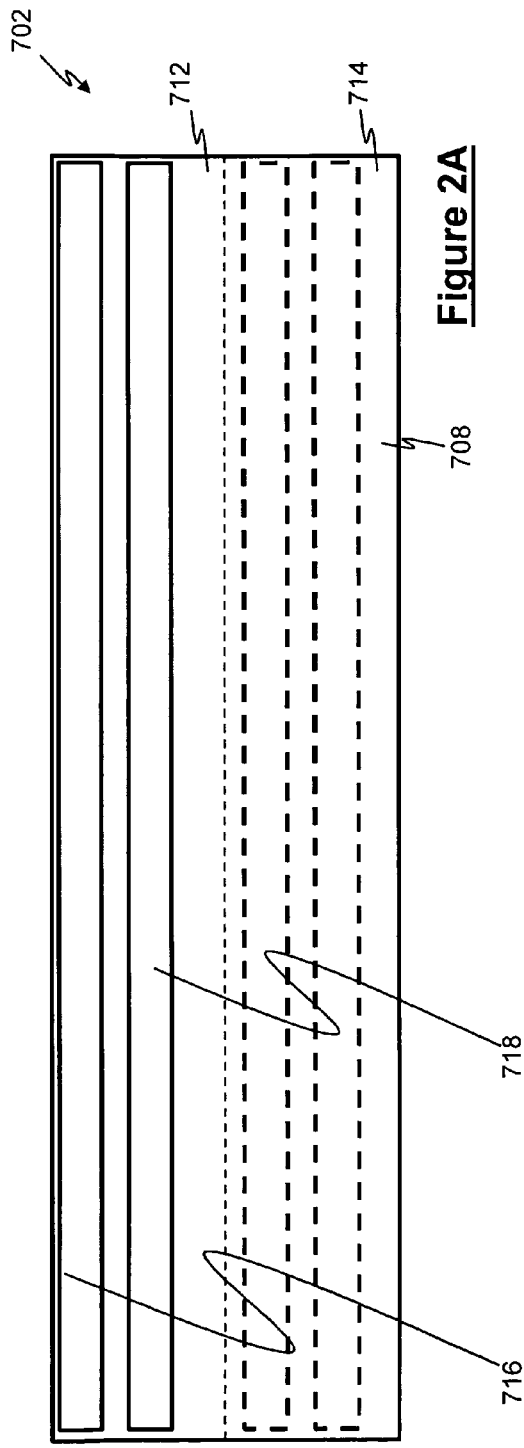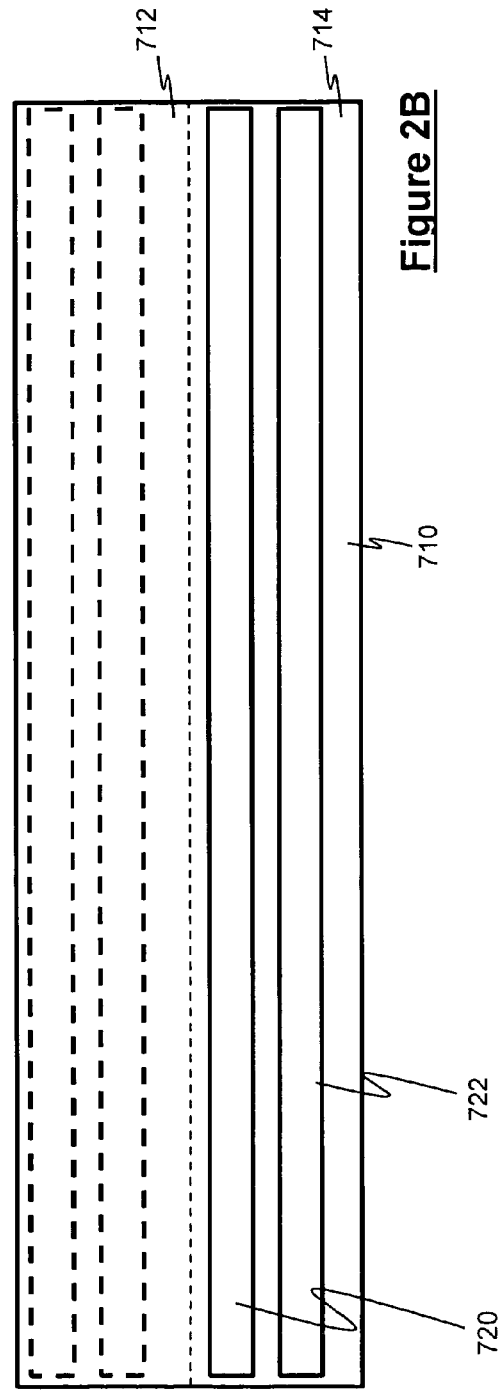

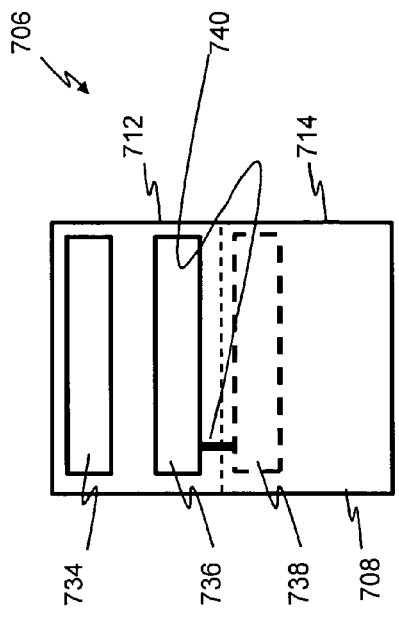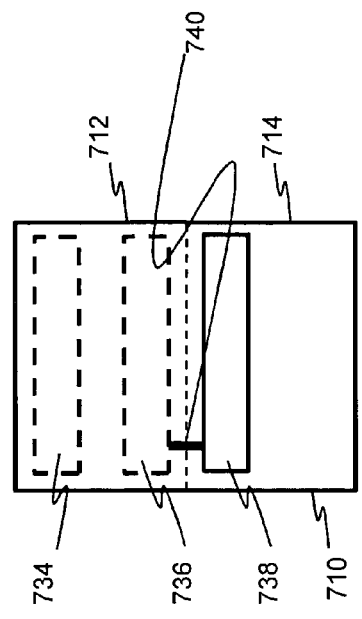
*Figure 4A*  *Figure 4B*
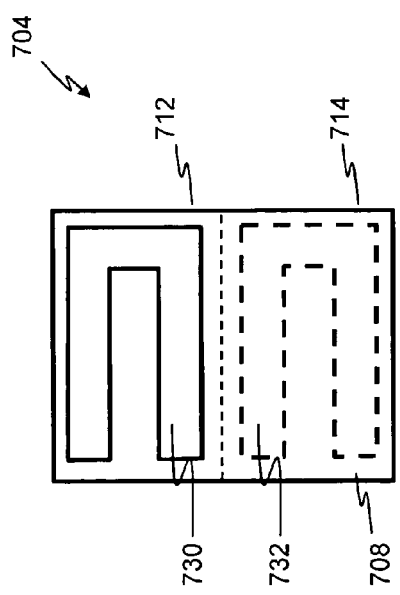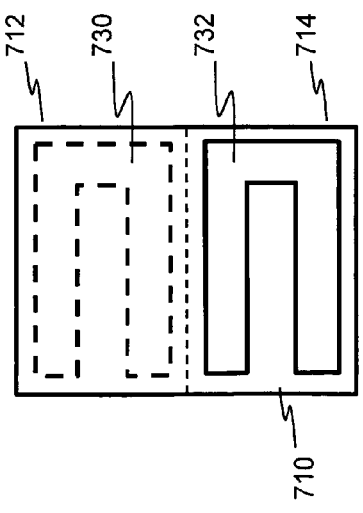
*Figure 3A*  *Figure 3B*

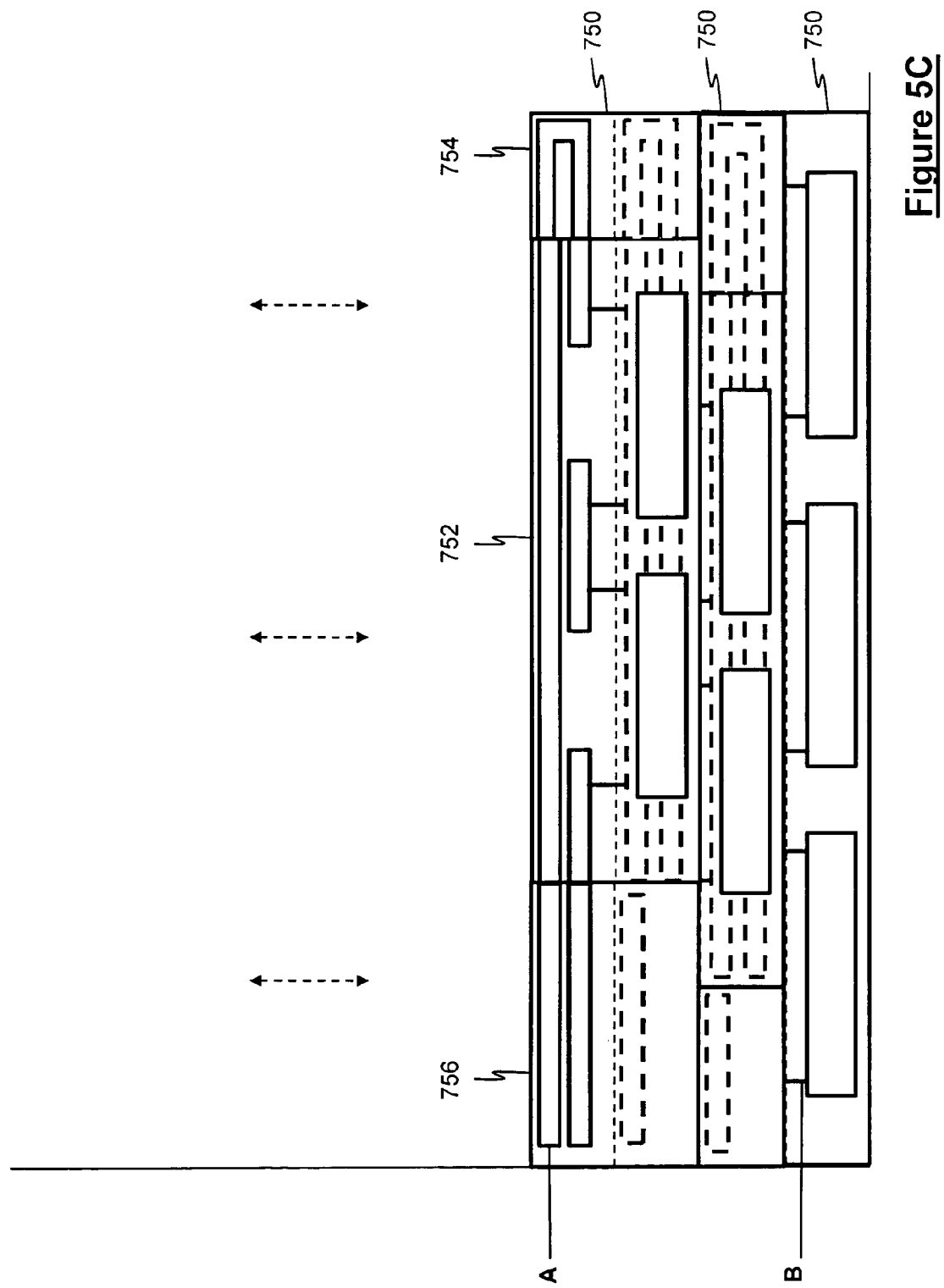

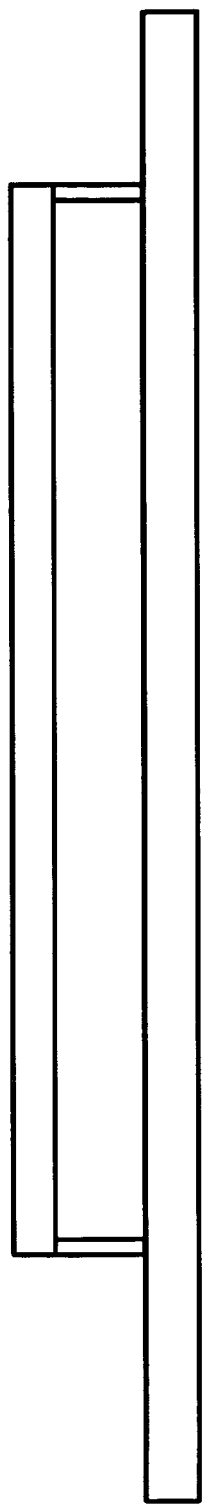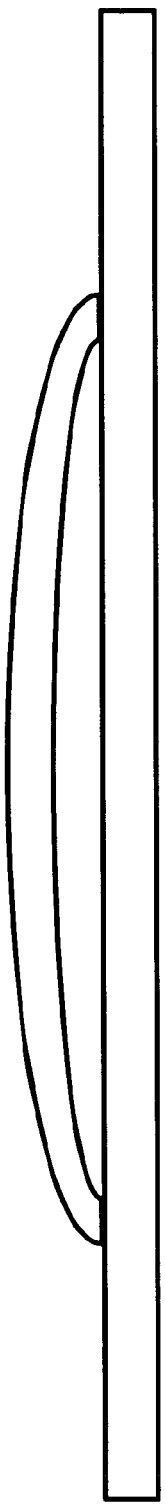

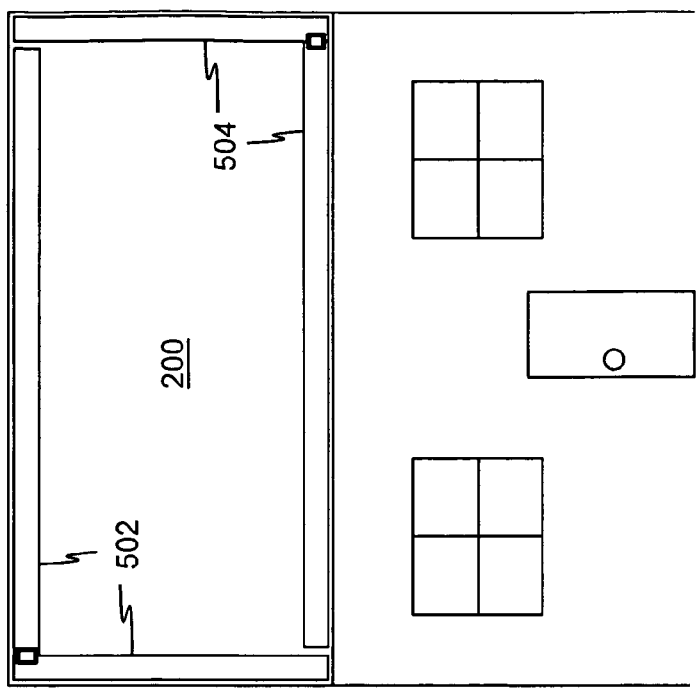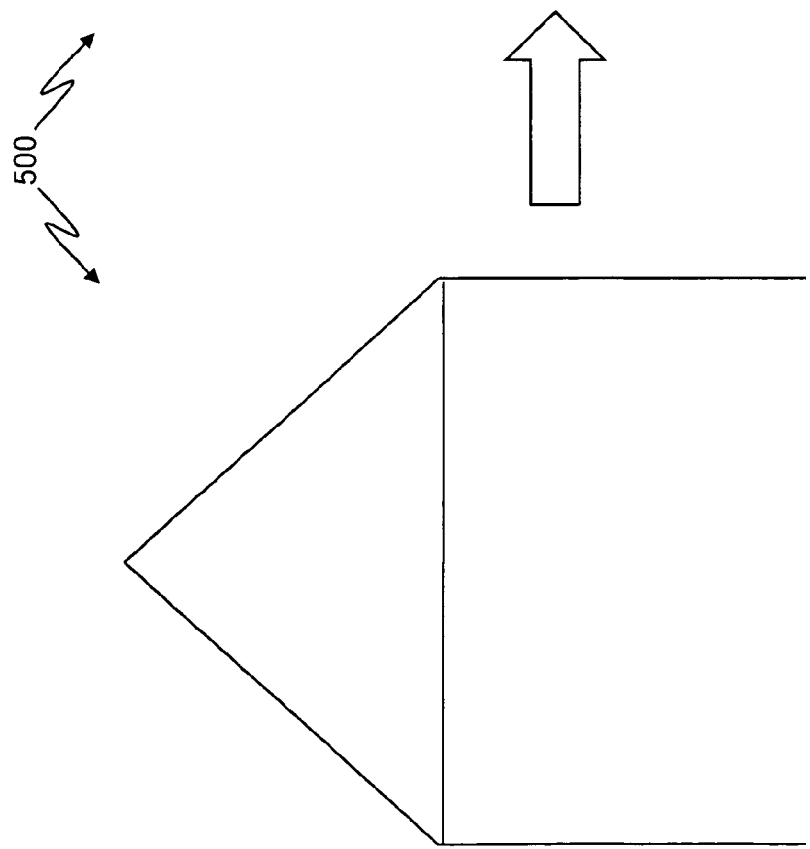
Figure 18

WIRELESS SOLAR SHINGLE PANEL AND A METHOD FOR IMPLEMENTING SAME

RELATED APPLICATIONS

This application claims benefit of U.S. Provisional Patent Application Ser. No. 61/209,368 filed Mar. 6, 2009, the contents of which are incorporated by reference herein it its entirety.

FIELD OF THE INVENTION

This invention relates generally to building materials and more particularly to a building material that covers an exterior portion of a building and which generates electrical power when exposed to sunlight.

BACKGROUND OF THE INVENTION

As the world's population increases, so too does the amount of energy being consumed. Unfortunately, this increased energy consumption has several undesirable consequences. One such consequence involves the introduction of pathogens and pollutants into the atmosphere from the burning of traditional fuel sources, such as coal, oil and natural gas. These pathogens and pollutants have a deleterious effect on both people and the environment. For example, the burning of fossil fuels generates greenhouse gases, such as carbon dioxide, which build up in the upper portion of the atmosphere. When sunlight is incident on the earth, these gases allow the sunlight to enter the atmosphere freely. The sunlight strikes the earths' surface where some of it is reflected back towards space as infrared radiation (i.e. heat). This infrared radiation is then trapped within the atmosphere by the greenhouse gases that have built up in the atmosphere causing an increase in global temperatures.

Another such consequence involves the cost of the fuel being used to generate the increased amount of energy. As mentioned hereinabove, fossil fuels are used to generate the energy required by the majority of the world's population and include oil, natural and coal. However, because fossil fuels are a non-renewable energy resource having finite global reserves, the cost of locating and extracting these fuels increase as these reserves are depleted. These costs are then passed onto the consumer. Additionally, methods for extracting these fuels not only create undesirable ecological consequences, but in some cases they are dangerous. One way to address these issues is to develop products that use less energy, but that achieve the same result. Unfortunately, while advances have been made in this area, they have not been sufficient enough to accomplish the needed reduction in the demand for increased energy. Another way to address these consequences is to take advantage of other naturally occurring and non-toxic sources of energy, such as wind power, solar power and water power.

One such attempt at addressing these issues includes the use of solar collectors to harness and convert the energy of sunlight into electrical energy. And although several devices that employ solar cells (collectors) have been develop for application to surfaces that are exposed to sunlight (such as rooftop solar cells), these devices are not easy to use and require the use of drilling a large number of holes through the surface to connect to a power handler device. This is undesirable due to the large number of connection points and thus, wires resulting in a large number of possible failure points.

SUMMARY OF THE INVENTION

A shingle configured for installation onto a structure of a building is provided, wherein the shingle includes a shingle back, the shingle back including at least one back conductive trace, and a shingle front configured to securely include at least one solar cell. The shingle front has at least one front conductive trace, wherein the at least one front conductive trace is configurable such that when the shingle front includes the at least one solar cell, the at least one solar cell is conductively connected to the at least one front conductive trace in a series fashion, wherein at least one of the at least one back conductive trace is conductively connected to at least one of the at least one front conductive trace and wherein the at least one of the at least one back conductive trace and the at least one of the at least one front conductive trace are configured such that when the shingle is associated with a like shingle, the at least one back conductive trace of the like shingle is conductively connected to the at least one front conductive trace of the shingle to be in an electrically series fashion.

A shingle system configured for installation on a roof of a building is provided, wherein the shingle system includes a plurality of shingles, wherein each of the plurality of shingles includes a shingle back having at least one back conductive trace and a shingle front having at least one front conductive trace. The shingle front is configurable to electrically connect at least one solar cell to the at least one front conductive trace in a series fashion. The shingle back and the shingle front are configured such that when a shingle of the plurality of shingles is associated with a like shingle of the plurality of shingles, the at least one back conductive trace of the like shingle is conductively associated with the at least one front conductive trace of the shingle in a series fashion.

A method for implementing a wireless solar shingle system is provided, wherein the wireless solar shingle system includes shingles having a shingle back which includes at least one back conductive trace, and a shingle front which includes at least one front conductive trace. The shingle front is configurable to electrically connect at least one solar cell to the at least one front conductive trace in an electrically series fashion. The method includes positioning a plurality of first layer shingles on a structure surface to form a first layer, anchoring the plurality of first layer shingles to the structure surface such that the plurality of first layer shingles are electrically connected to adjacent first layer shingles in series fashion via at least one of the at least one front conductive trace and the at least one back conductive trace. The method also includes positioning a plurality of second layer shingles on the structure surface to form a second layer and anchoring the plurality of second layer shingles to the structure surface such that the plurality of second layer shingles are electrically connected to the adjacent second layer shingles and the first layer in series fashion via at least one of the at least one front conductive trace and the at least one back conductive trace.

A method for fabricating a wireless solar shingle is provided, wherein the wireless solar shingle includes a shingle front and a shingle back. The method includes depositing an electrically conductive material on the shingle front to form a front trace, wherein the front trace includes a front trace start and a front trace end. The method also includes depositing an electrically conductive material on the shingle back to form a back trace, wherein the back trace includes a back trace start and a back trace end and connecting the back trace start with the front trace end such that the back trace end is electrically connected with the front trace start via a series connection.

BRIEF DESCRIPTION OF THE DRAWINGS

The foregoing and other features and advantages of the present invention will be more fully understood from the following detailed description of illustrative embodiments, taken in conjunction with the accompanying drawings in which like elements are numbered alike:

FIG. 1A is a layout view of a convention approach as shingling a roof.

FIG. 2A is a top down view of a base shingle showing the traces on the top side of the shingle in accordance with one embodiment.

FIG. 2B is a bottom up view of the base shingle in FIG. 2A showing the traces on the bottom side of the shingle

FIG. 3A is a top down view of a continuity shingle showing the traces on the top side of the shingle, in accordance with one embodiment.

FIG. 3B is a bottom up view of the continuity shingle of FIG. 3A showing the traces on the bottom side of the shingle.

FIG. 4A is a top down view of a jumper shingle showing the traces on the top side of the shingle, in accordance with one embodiment.

FIG. 4B is a bottom up view of the jumper shingle of FIG. 4A showing the traces on the bottom side of the shingle.

FIG. 5C is a top down view of the shingles of FIG. 1, FIG. 3A and FIG. 4A being associated with a roof and each other, in accordance with one embodiment.

FIG. 7B is a side view of a wireless solar panel configured away from the shingle via a spacer.

FIG. 7C is a side view of a wireless solar panel configured in a bowed configuration.

FIG. 18 is a schematic block diagram illustrating the structure of FIG. 15 and showing one alternative embodiment of the main negative and positive traces for implementing the wireless solar panel of FIG. 10, in accordance with the present invention.

DETAILED DESCRIPTION OF THE INVENTION

As disclosed herein with regards to an exemplary embodiment, the present invention provides an improvement in an article and system for converting solar energy into electrical energy. It should be appreciated that the present invention may be utilized with both individual solar cells or solar panels (i.e. a collection of solar cells) where the cells and/or panels may be flexible (such as via a rollable sheet) or non-flexible (such as a rigid panel). As such, the solar shingle may include solar panels, individual solar cells and/or any combination thereof. It is also contemplated that the present invention may be used with other materials that have solar collection characteristics, such as a coating or other material that have properties similar to solar collectors. For example, materials that have heat absorbing characteristics may be used with thermocouple devices. Moreover, although the invention is described herein as being connected in a series fashion, it is contemplated that the solar cells/panels may be connected in a parallel fashion as well.

Figure 1B:
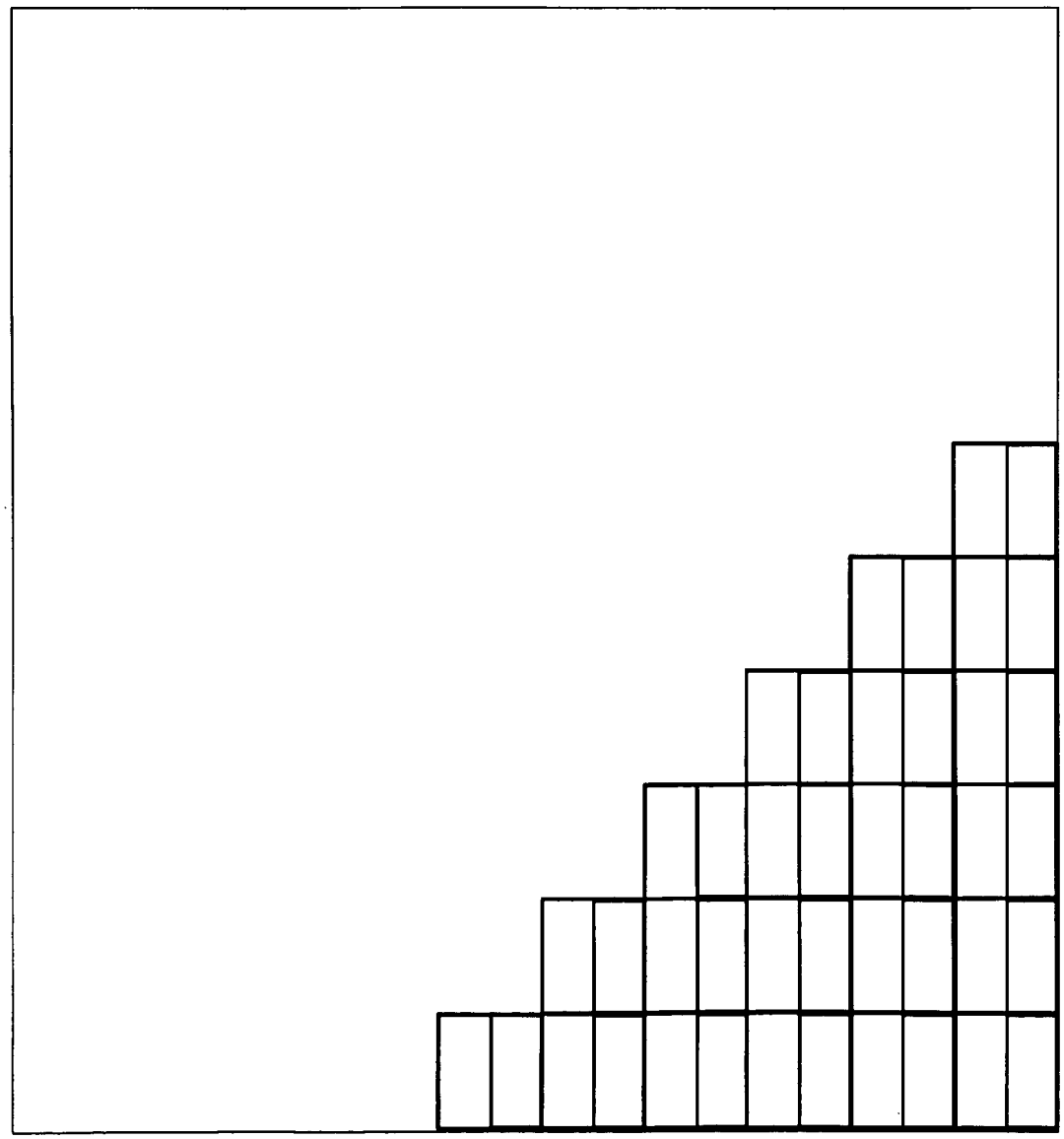
FIG. 1B is a layout view of the approach in FIG. 1 with the shingles installed.

It should be appreciated that although the wireless solar shingle is described herein as being installed using conventional methods for installing roofing shingles, the wireless solar shingle may be installed using any method suitable to the desired end purpose. Referring to FIG. 1A, conventional methods for installing roofing shingles, or associating the roofing shingles with the roof of a structure, may be used and includes laying out and attaching a first roofing shingle having a size of 36 inches in length and 12 inches in width to the bottom portion of a roof. As known, this may be accomplished via roofing nails or any other suitable anchoring device or method. A second roofing shingle having a size of 30 inches in length and 12 inches in width is then located on the roof to cover a portion of the width of the first roofing shingle, a third roofing shingle having a size of 24 inches in length and 12 inches in width is located on the roof to cover a portion of the width of the second roofing shingle, a fourth roofing shingle having a size of 18 inches in length and 12 inches in width is located on the roof to cover a portion of the width of the third roofing shingle, a fifth roofing shingle having a size of 12 inches in length and 12 inches in width is located on the roof to cover a portion of the width of the fourth roofing shingle and a sixth roofing shingle having a size of 6 inches in length and 12 inches in width is located on the roof to cover a portion of the width of the fifth roofing shingle. The resultant pattern is shown in FIG. 1B. This approach is repeated until the width and height of the roof is completely covered in roofing shingles.

In accordance with an exemplary embodiment, a wireless solar shingle system 700 is provided and includes at least one base shingle 702, at least one continuity shingle 704 and at least one jumper shingle 706, each of which has a top side 708 and a bottom side 710 and is divided into an upper portion 712 and a lower portion 714. Referring to FIG. 2A and FIG. 2B, the base shingle 702 is shown and includes a first trace 716 and a second trace 718 on the upper portion 712 of the top side 708 and a third trace 720 and a fourth trace 722 on the lower portion 714 of the bottom side 710. It should be appreciated that although the first trace 716 and the second trace 718 are shown as being located towards the top of the upper portion 712 to avoid the nail line (used to nail the shingle to a roof), they may be located on the top side 708 as desired. It should also be appreciated that the traces may be sized (in width) such that if located in the nail like, electrical continuity of the trace would not be compromised. Additionally, although the third trace 720 and the fourth trace 722 are shown as being located towards the top of the lower portion 714, they too may be located on the bottom side 710 as desired. However, they should be located on the bottom side 710 such that when the shingle is associated with other like shingles, the third trace 720 and fourth trace 722 are aligned with the first trace and second trace of the associated like shingles.

Figure 2C:
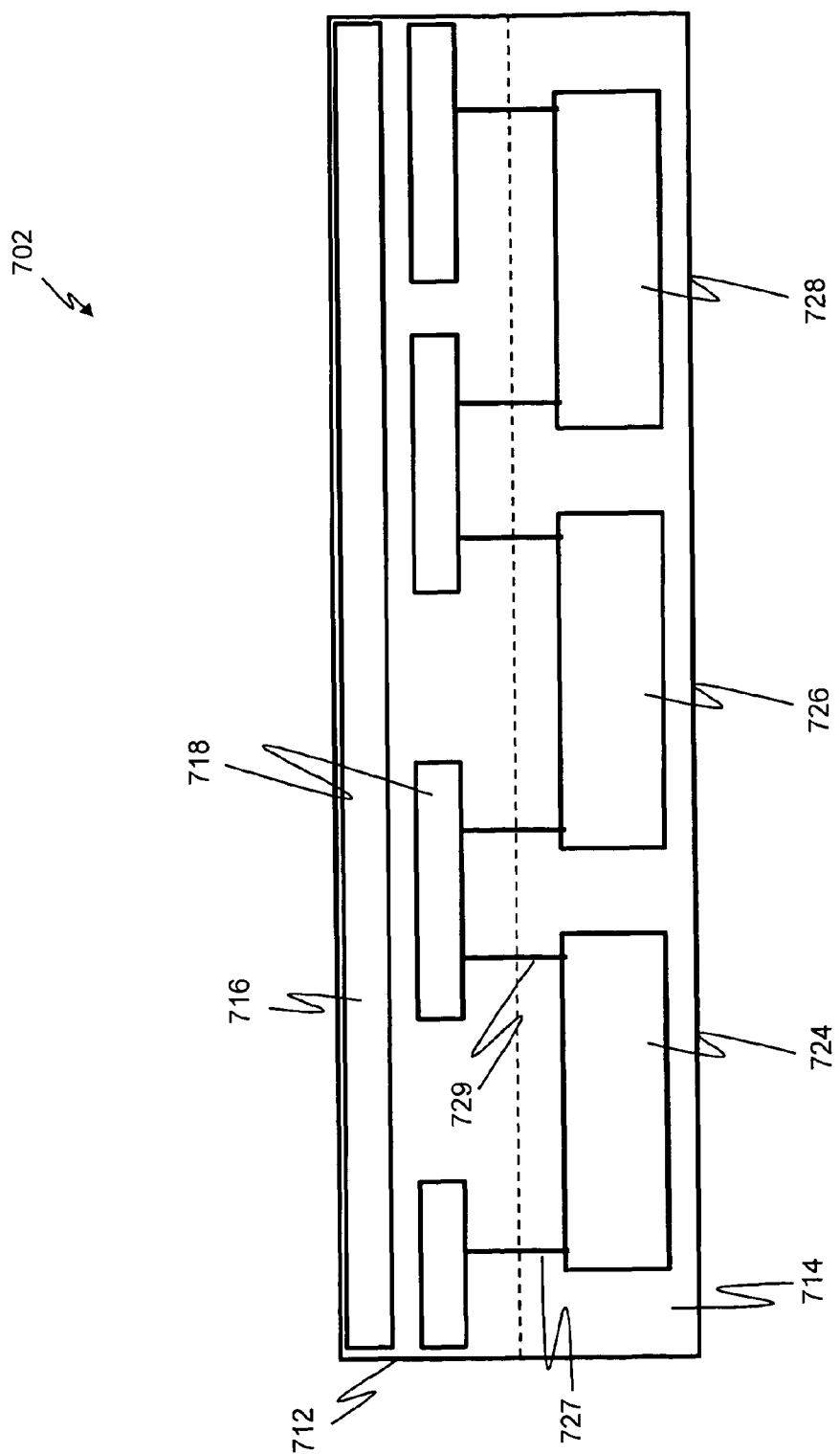
FIG. 2C is a top down view of the base shingle of FIG. 2A having solar panels and showing the connections between the traces and the solar panels, in accordance with one embodiment.

It is contemplated that the base shingle 702 may be supplied with a solar panel attached or may be configured such that a solar panel may be attached in the future as desired (i.e. after installation). Referring to FIG. 2C, a base shingle 702 having a plurality of solar panels is shown and includes a first solar panel 724, a second solar panel 726 and a third solar panel 728, wherein each of the solar panels 724, 726, 728 include a first connection lead 727 and a second connection lead 729. When solar energy is incident on the solar panels 724, 726, 728, an electrical potential difference is present between the first connection lead 727 and the second connection lead 729. As shown, the solar panels 724, 726, 728 are attached to the base shingle and the first connection lead 727 and the second connection lead 729 are connected to the second trace 718. Note that the second trace 718 has numerous 'breaks' or discontinuities to prevent shorting of the first connection leads 727 and the second connection leads 729 of each of the solar panels 724, 726, 728. Accordingly, solar panels 724, 726, 728 are electrically connected in series. it should be appreciated that the base shingle 702 may include one or more solar cell panels 724, wherein the second trace 718 may be configured responsive to the number of panels by simply cutting and removing the unwanted conductive pieces of trace. Also, the solar panels may be any type of solar panel suitable to the desired end purpose, such as for example, the Powerfilm® Rollable Solar Charger cells or Powerfilm® Solar Cell PT15-75 Flexible Solar Panel.

Referring to FIG. 3A and FIG. 3B, the continuity shingle 704 is shown and includes a top continuity trace 730 on the upper portion 712 of the top side 708 and a bottom continuity trace 732 on the lower portion 714 of the bottom side 710. Referring to FIG. 4A and FIG. 4B, the jumper shingle 706 is shown and includes a first jumper trace 734 and a second jumper trace 736 on the upper portion 712 of the top side 708 and a third jumper trace 738 on the lower portion 714 of the bottom side 710. The third jumper trace 738 is electrically connected to the second jumper trace 736 via a trace connection 740. It should be appreciated that base shingles 702, continuity shingles 704 and jumper shingles 706 may be sized (both width and length) as desired, such as are commonly sized shingles in the industry, for example, 12" width and 36" length.

Figure 5A:
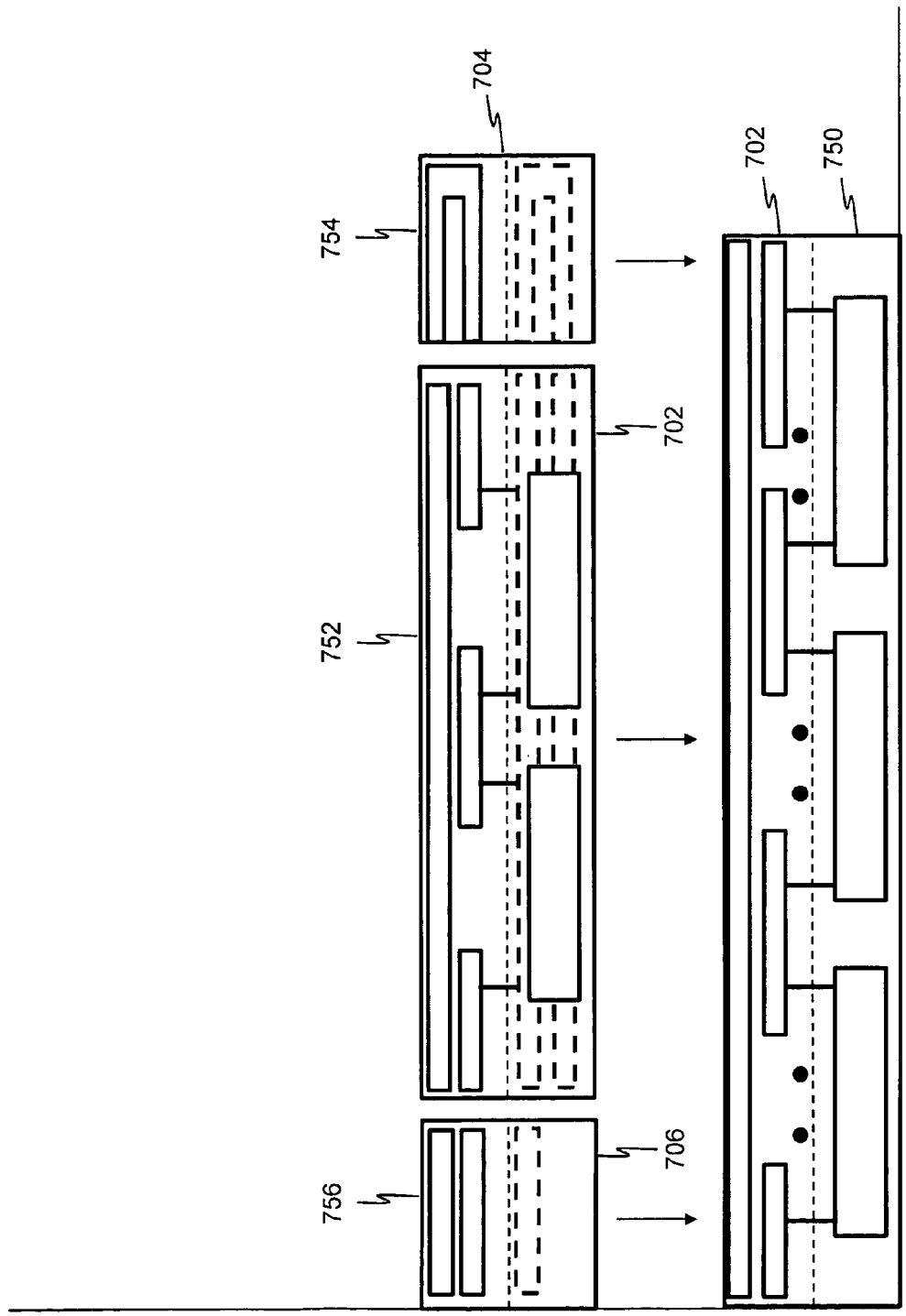
FIG. 5A is a top down view of the shingles of FIG. 1, FIG. 3A and FIG. 4A being associated together, in accordance with one embodiment.
Figure 5B:
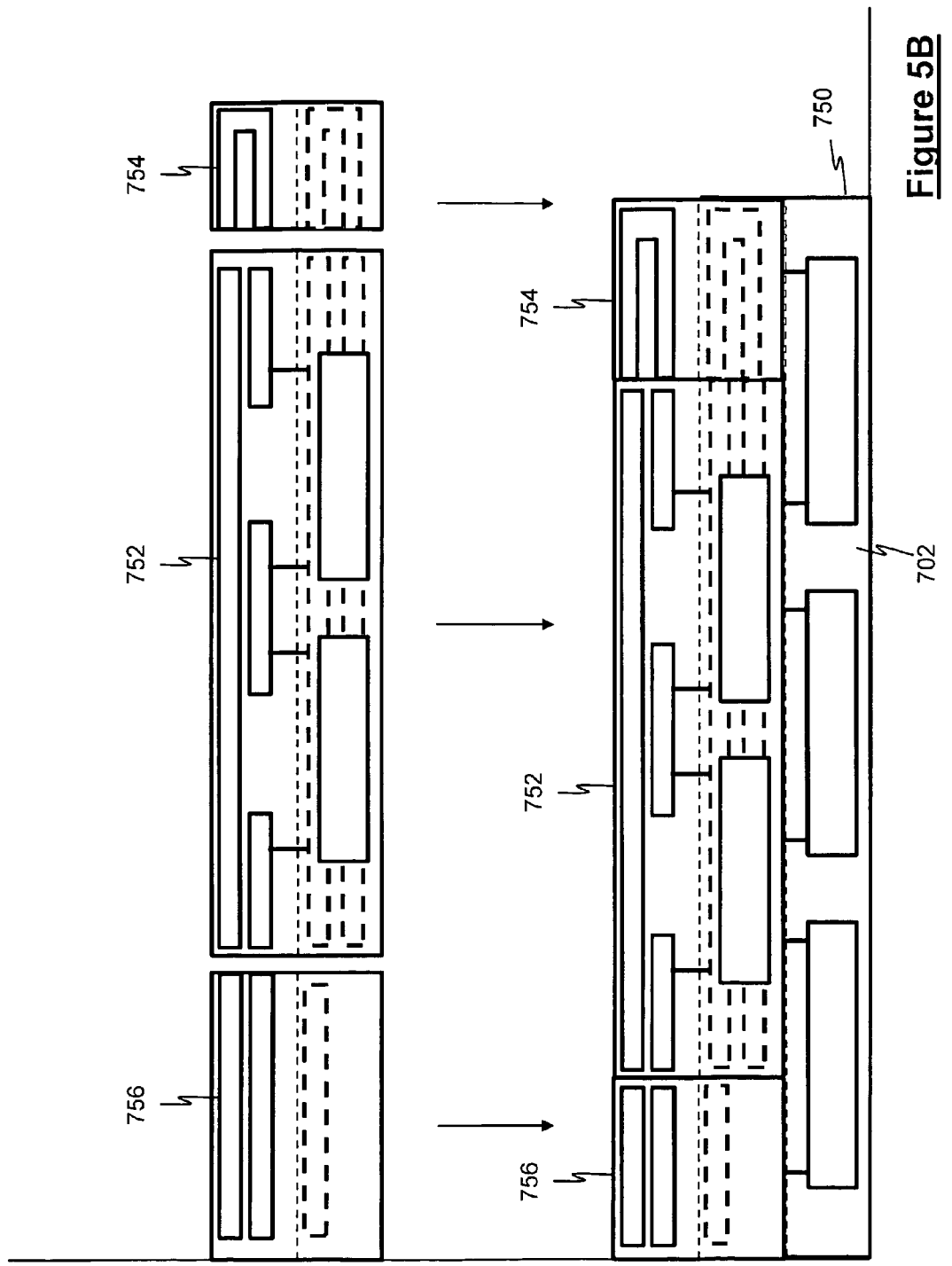
FIG. 5B is a top down view of the shingles of FIG. 1, FIG. 3A and FIG. 4A being associated with a roof and each other, in accordance with one embodiment.

Referring to FIG. 5A, the wireless solar shingle system 700 may be implemented accordingly to one embodiment by positioning a first base shingle 750 having a 36" length on the roof of a structure, such as in bottom corner of the roof, and nailing the base shingle 702 to the roof, as shown. The first base shingle 702 is then connected to the roof using conventional methods, such as nails. A second base shingle 752 having a 24" inch length is then positioned over and toward the center of the first base shingle 750 such that the third trace 720 and the fourth trace 722 of the second base shingle 752 overlay and contact the first trace 716 and second trace 718 of the first shingle 750, respectively. As shown, it should be appreciated that the fourth trace 722 of the second base shingle 752 should be configured as discussed hereinabove to not short circuit the solar panels 724, 726, 728 on the first base shingle 750. For example, in this case the fourth trace 722 can be removed altogether. A 12" length first continuity shingle 754 is then positioned to the side of the second base shingle 752 to overlay a portion of the second base shingle 752 such that the bottom continuity trace 732 overlays and contacts first trace 716 and second trace 718 of first base shingle 750. This connects the circuit between first trace 716 and second trace 718. A first jumper shingle 756 is then positioned to the side (opposite the continuity shingle 754) of the second base shingle 752 to overlay a portion of the second base shingle 752 such that the third jumper trace 738 overlays and contacts first trace 716. This is shown in FIG. 5B.

Figure 5D:
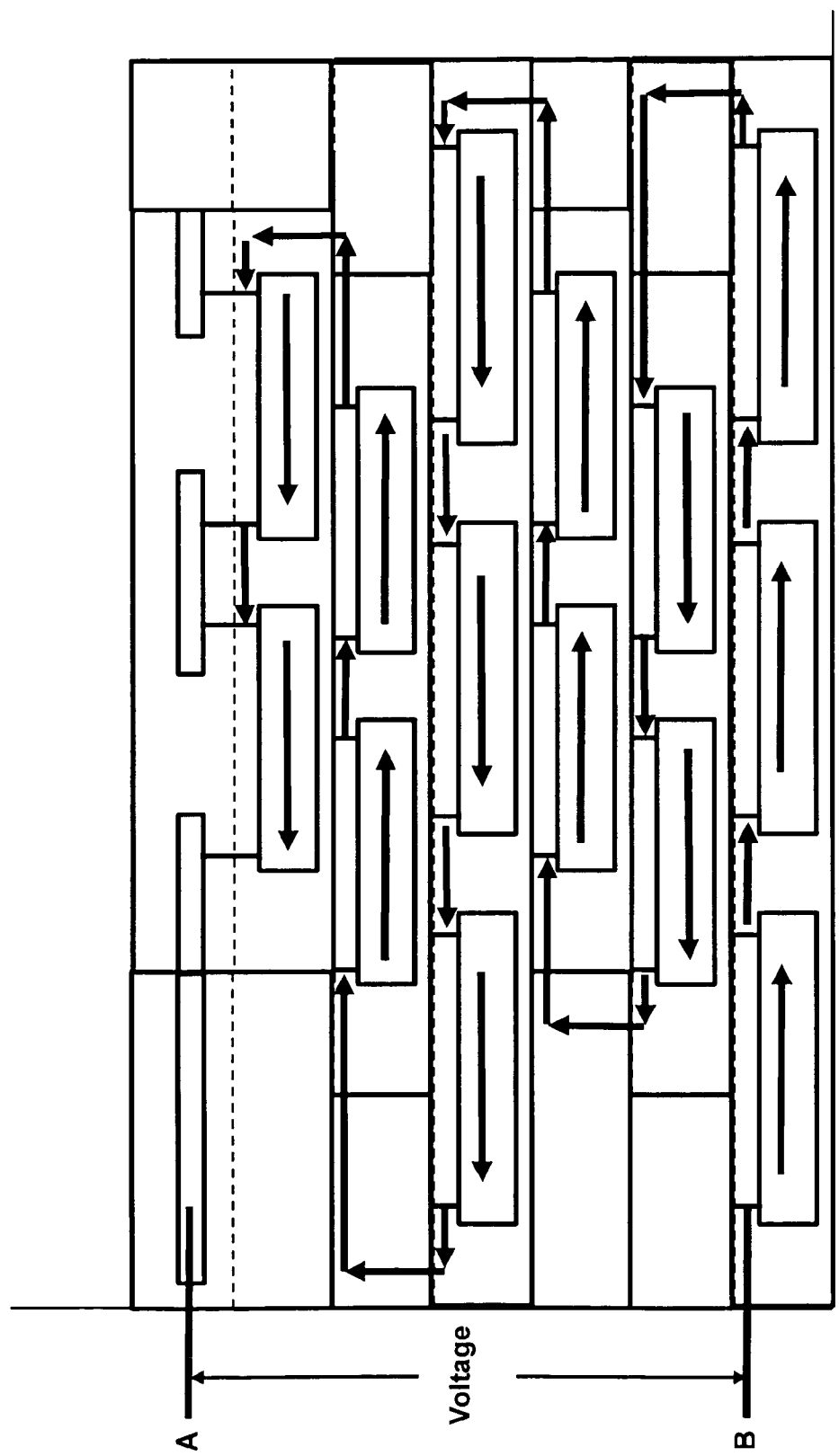
FIG. 5D is a top down view of the shingles of FIG. 1, FIG. 3A and FIG. 4A associated with a roof showing the circuit flow.

Referring to FIG. 5C, a third base shingle 758 may then be associated with the second base shingle 752 in the same fashion that that second base shingle 752 is associated with the first base shingle 750. Although for these purposes, the third base shingle 758 is shown as being 24" in length, the third base shingle 758 may of any size desired. The third base shingle 758 is positioned over the second base shingle 752 such that the third trace 720 and the fourth trace 722 of the third base shingle 758 overlays and contacts the first trace 716 and second trace 718 of the second base shingle 752, respectively. As before, the fourth trace 722 of the third base shingle 758 should be configured to ensure the circuit connection between the first jumper shingle 756, the second base shingle 752 and the first continuity shingle 754 and to not cause a short of the solar panels on the second base shingle 752. A 6" length second continuity shingle 760 is then positioned to the side of the third base shingle 758 to overlay a portion of the second base shingle 758 such that the bottom continuity trace 732 overlays and contacts the first trace 716 and the second trace 718 of the second base shingle 752. This connects the circuit between first trace 716 and second trace 718. A second jumper shingle 762 is then positioned to the side (opposite the continuity shingle 760) of the third base shingle 758 to overlay a portion of the third base shingle 758 such that the third jumper trace 738 overlays and contacts first trace 716. The second jumper shingle 762 is sized as desired. Accordingly, all of the solar panels in FIG. 5C are electrically connected in series such that a potential difference exists between Point A and Point B. This process can be repeated until the roof is shingled. The 'flow' of electricity through the shingles is represented in FIG. 5D as arrows showing a series circuit connection such that a potential difference (i.e. voltage) exists between point A and point B.

Figure 5E:
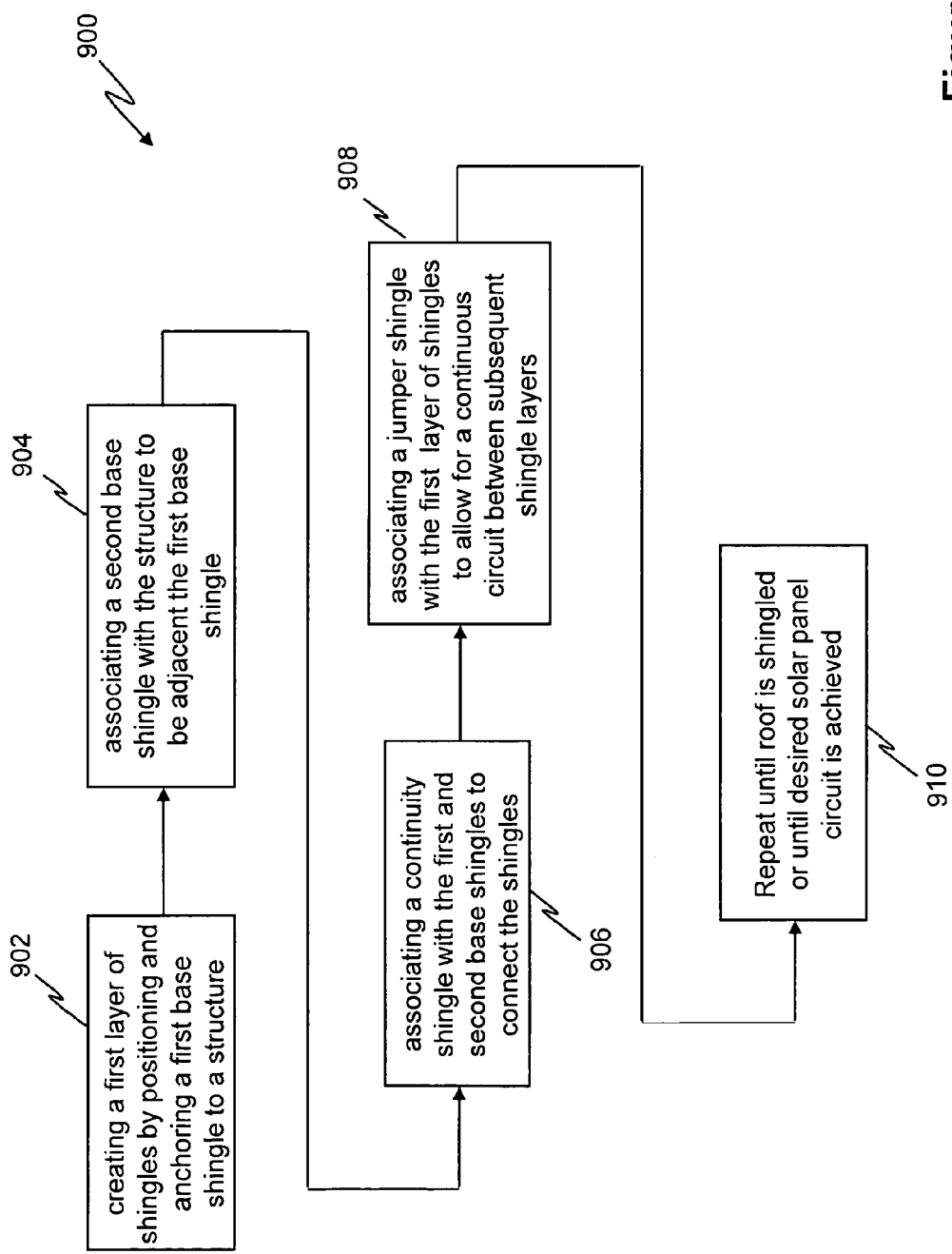
FIG. 5E is a block diagram illustrating one embodiment for associating the shingles of FIG. 1, FIG. 3A and FIG. 4A with a roof.

Referring to FIG. 5E, one embodiment of a method 900 for implementing the wireless solar shingle system 700 is illustrated and includes creating a first row of shingles by positioning and anchoring a first base shingle, as shown in operational block 902. This is typically a 36" shingle, but may be any sized shingle as desired. Depending upon the size of the roof that is being shingled, additional base shingles may be associated with the first base shingle, wherein each of the base shingles may be electrically connected together via continuity shingles and wherein a jumper shingle is used to create a continuous circuit, as shown in operational blocks 904, 906 and 908, where the traces are configured to electrically connect the traces on the two shingles (and thus any solar panels if present) in series fashion. This allows the first layer of shingles to be electrically connected to subsequent layers of shingles. The process may then be repeated until the roof is shingled and/or the desired solar panel circuit is achieved, as shown in operational blocks 910.

Figure 6:
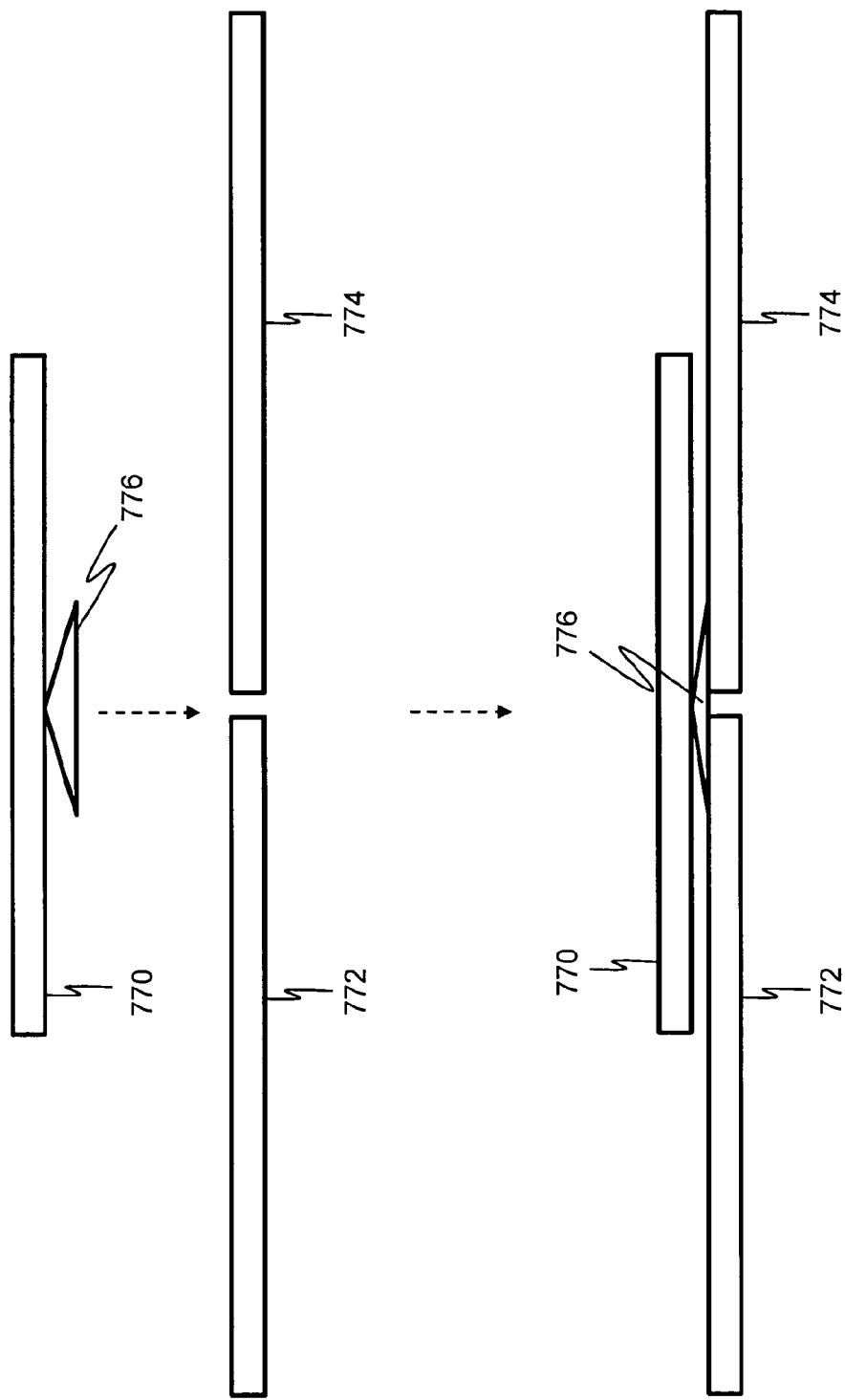
FIG. 6 is a side view of a resilient connection member, in accordance with one embodiment.
Figure 7A:
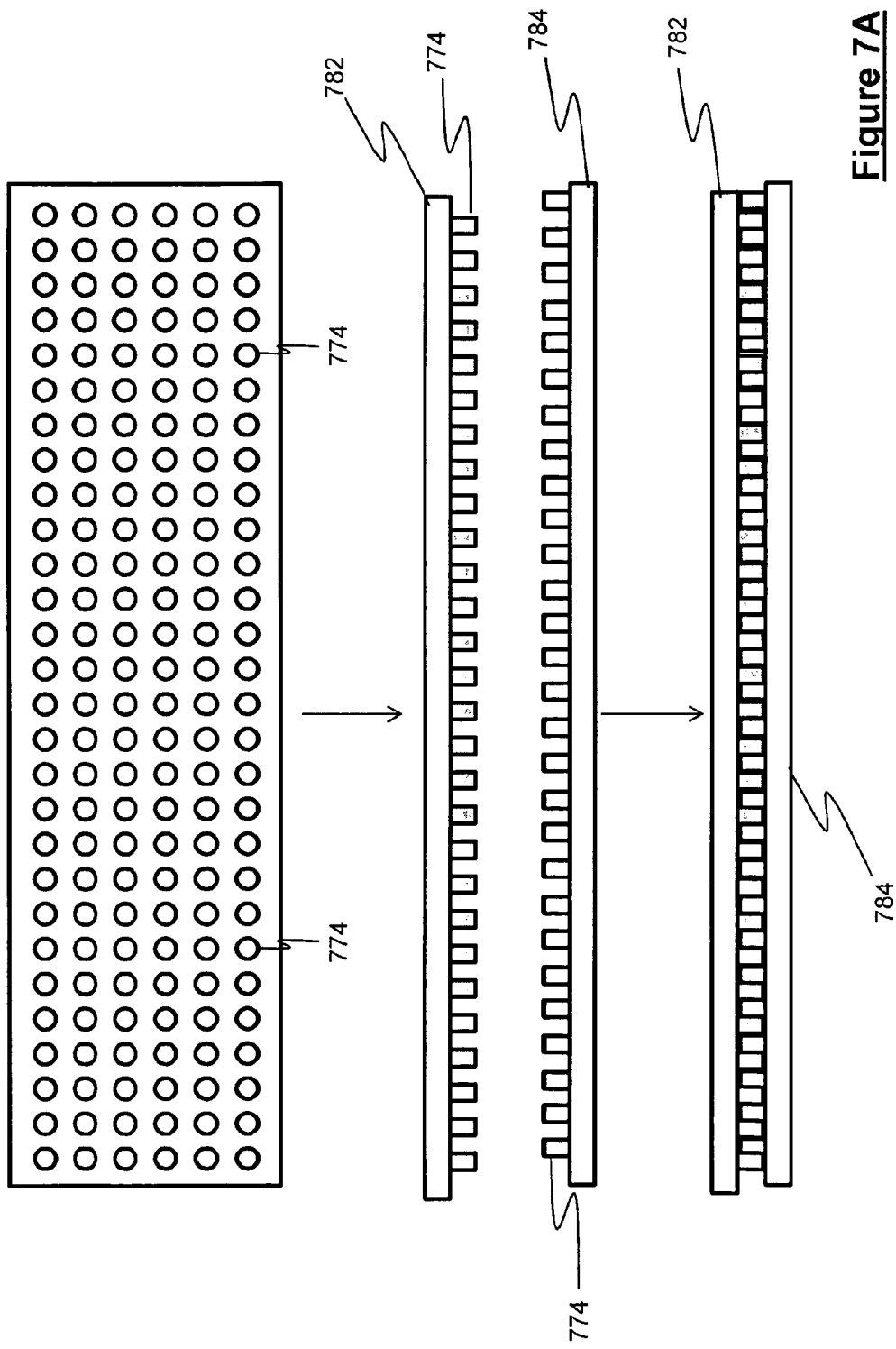
FIG. 7A is a side view of an interlocking trace, in accordance with another embodiment.

It should be appreciated that the connection points between traces on adjacent shingles may be weak or subject to environmental conditions. For example, if an overlying shingle 770 is used to make a connection between traces on two underlying shingles 772, 774 and the overlying shingle 770 is warped (for example due to environment or age), that connection may not be reliable. Accordingly, one embodiment includes a resilient connection member 776 in electrical communication with the traces may be used to account for that warping of the overlying shingle 770. The resiliency of the connection member 776 is such that it will ensure the connection between the traces, but will not cause the overlying shingle 770 to be raised significantly if at all. This is illustrated in FIG. 6. Another embodiment includes traces that have a plurality of protrusions 780, as shown in FIG. 7, where the plurality of protrusions are sized and space such that when a like trace 782 is positioned on top of a trace 784, the protrusions of one trace securingly and snugly fit into the spaces around the protrusions of the like trace, in a LEGO® like fashion.

Figure 7D:
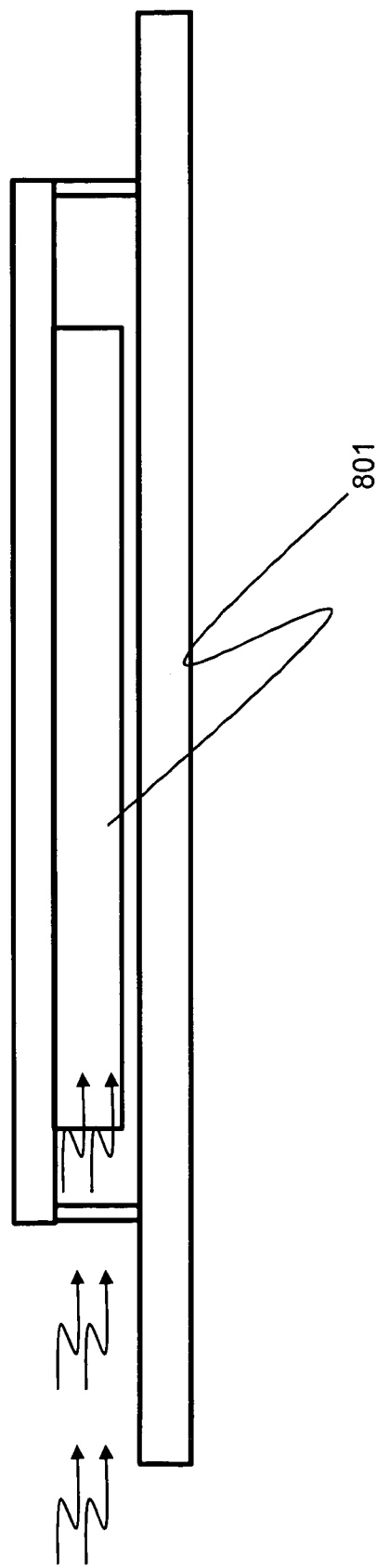
FIG. 7D is a side view of a wireless solar panel having a condensation collector configured to collect and retain water.

It should be appreciated that the base shingles, continuity shingles and jumper shingles of the invention may be configured as desired responsive to the layout of the shingles on a roof. The traces on the base shingles, continuity shingles and jumper shingles may be configured to complete the circuit of the solar panels as desired. It should also be appreciated that the shingles may only include the traces without the solar panels, where the solar panels can be attached at a later time or not at all. Additionally, the solar panels may be integrated with the shingles or they may be associated with the shingles during or after installation of the shingles, where the solar panels may be connected to the shingles via any method suitable to the desired end purpose, such as via a soldered wire connection, adhesive, friction or via a plug-in connection. It should also be appreciated that the solar panels may be raised from the shingle surface to provide airflow over and under the solar panel. This may be accomplished using any method or device suitable to the desired end purpose, such as by using a spacer between the solar panel and the shingle (see FIG. 7B) or by using a flexible solar panel and installing the panel in a bowed fashion (See FIG. 7C). Referring to FIG. 7D, it is further contemplated that the solar panel may include a condensation collector having a pocket which is configured to retain water (or other coolant fluid) to help dissipate heat from the solar cell. In one embodiment the condensation collector 801 may be configured to collect water flowing down a roof over the shingles, where the water remains in the pocket and dissipates heat via contact cooling or radiant cooling.

In accordance with a second embodiment, a wireless solar shingle system 800 is provided and includes at least one base wireless solar shingle 802 and at least one connecting wireless solar shingle 820, wherein the base wireless solar shingles 802 and connecting wireless solar shingles 820 may be configured to include at least one solar panel (cell). The shingles in the wireless solar shingle system 800 are configured to electrically interconnect with each other such that when installed on a roof of a structure, the solar panels (having solar cells) connected to the shingles are electrically connected in series fashion. This is accomplished by strategically located electrical traces on (and/or in) the wireless solar shingle to connect the solar panels in series fashion.

Figure 8A:
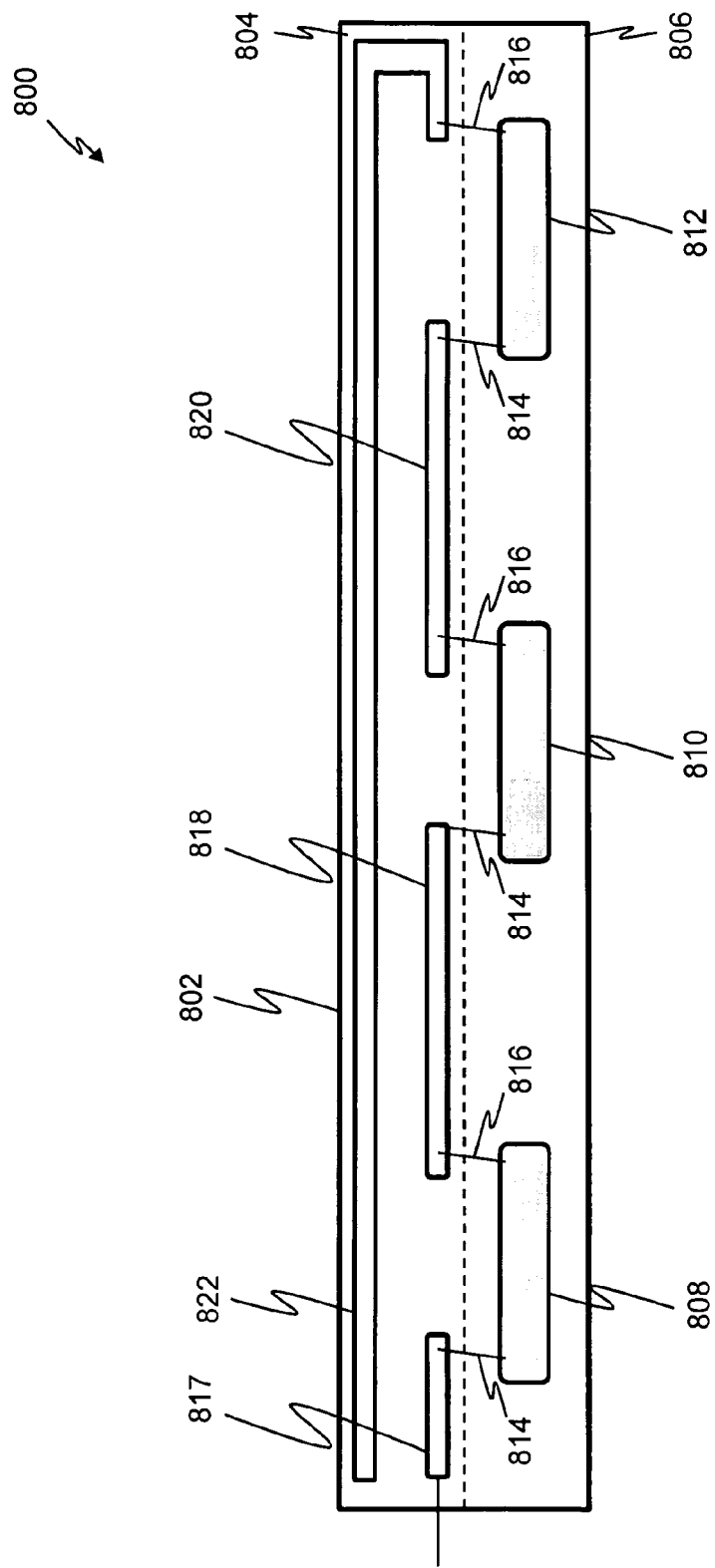
FIG. 8A is a top down view of a base wireless solar shingle in accordance with another embodiment.

Referring to FIG. 8A, one embodiment of a base shingle 802 is shown and is separated into an upper portion 804 and a lower portion 806. The lower portion 806 includes a first solar panel 808, a second solar panel 810 and a third solar panel 812, wherein each of the solar panels 808, 810, 812 includes a first lead 814 and a second lead 816 such that when photons contact the solar panels 808, 810, 812, a potential difference exists between the first lead 814 and the second lead 816. The upper portion 804 of base shingle 802 includes an initial trace 817, a first trace 818, a second trace 820 and a third trace 822. The first trace 818 connects the second lead 816 of first solar panel 808 with the first lead 814 of the second solar panel 810, the second trace 820 connects the second lead 816 of second solar panel 810 with the first lead 818 of third solar panel 812 and the third trace 822 connects the second lead 816 with the first lead of the first solar panel on a connecting solar shingle that is associated with the base shingle 802. This is discussed further hereinafter.

Figure 8B:
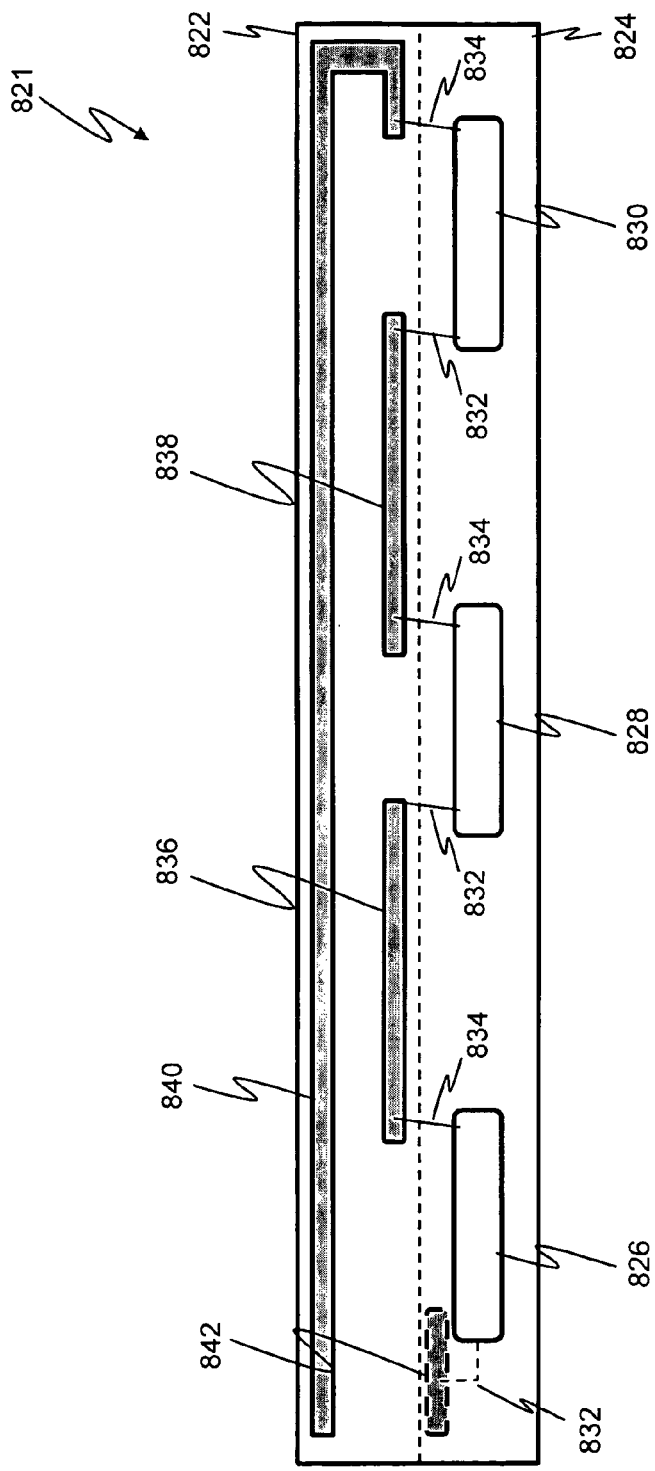
FIG. 8B is a top down view of a connecting wireless solar shingle in accordance with the embodiment of FIG. 8A.

Referring to FIG. 8B, one embodiment of a connecting shingle 821 is shown and also separated into an upper portion 822 and a lower portion 824. The lower portion 824 includes a first solar panel 826, a second solar panel 828 and a third solar panel 830, wherein each of the solar panels 826, 828, 830 includes a first lead 832 and a second lead 834 such that when photons contact the solar panels 826, 828, 830, a potential difference exists between the first lead 832 and the second lead 834. The upper portion 822 of connecting shingle 820 includes a first trace 836, a second trace 838 and a third trace 840. The first trace 836 connects the second lead 834 of first solar panel 826 with the first lead 832 of second solar panel 828, the second trace 838 connects the second lead 834 of second solar panel 828 with the first lead 832 of third solar panel 830 and the third trace 840 connects the second lead 834 with the first lead of the first solar panel on the next connecting solar shingle that is associated with the connecting shingle 821. In addition, the connecting shingle 821 includes a connecting trace 842 on the underside of the connecting shingle 821 to connect with the third trace of a shingle with which the connecting shingle 821 is associated, such as a base shingle or another connecting shingle. This connecting trace 842 may be located on the underside of the connecting shingle 821 near the top of the lower portion 824 or near the bottom of the upper portion 822. This is described immediately hereinafter.

Figure 9A:
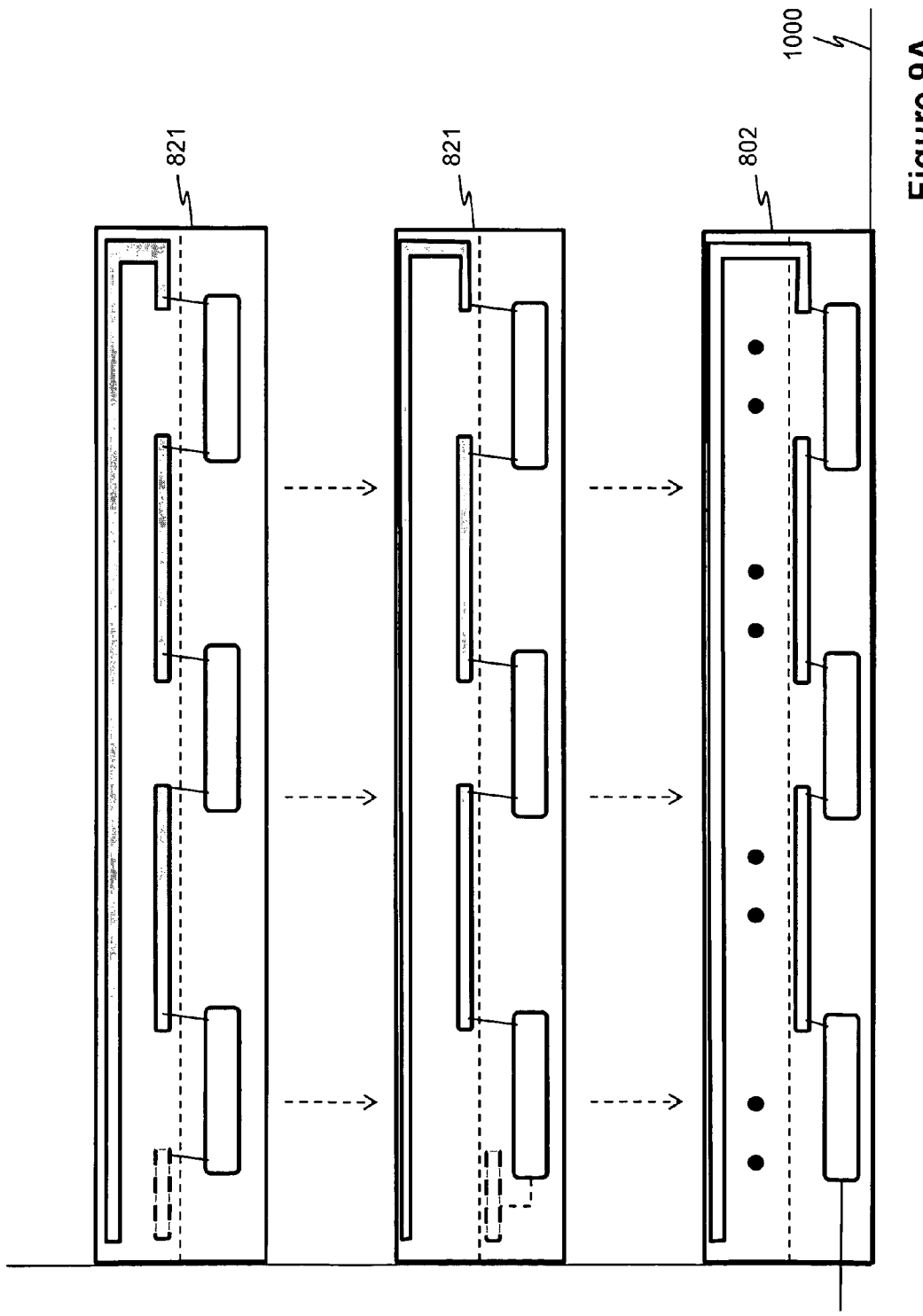
FIG. 9A is a top down view of the base connecting wireless solar panel of FIG. 8A and the connecting wireless solar panel of FIG. 8B being associated with a roof and each other, in accordance with another embodiment.
Figure 9B:
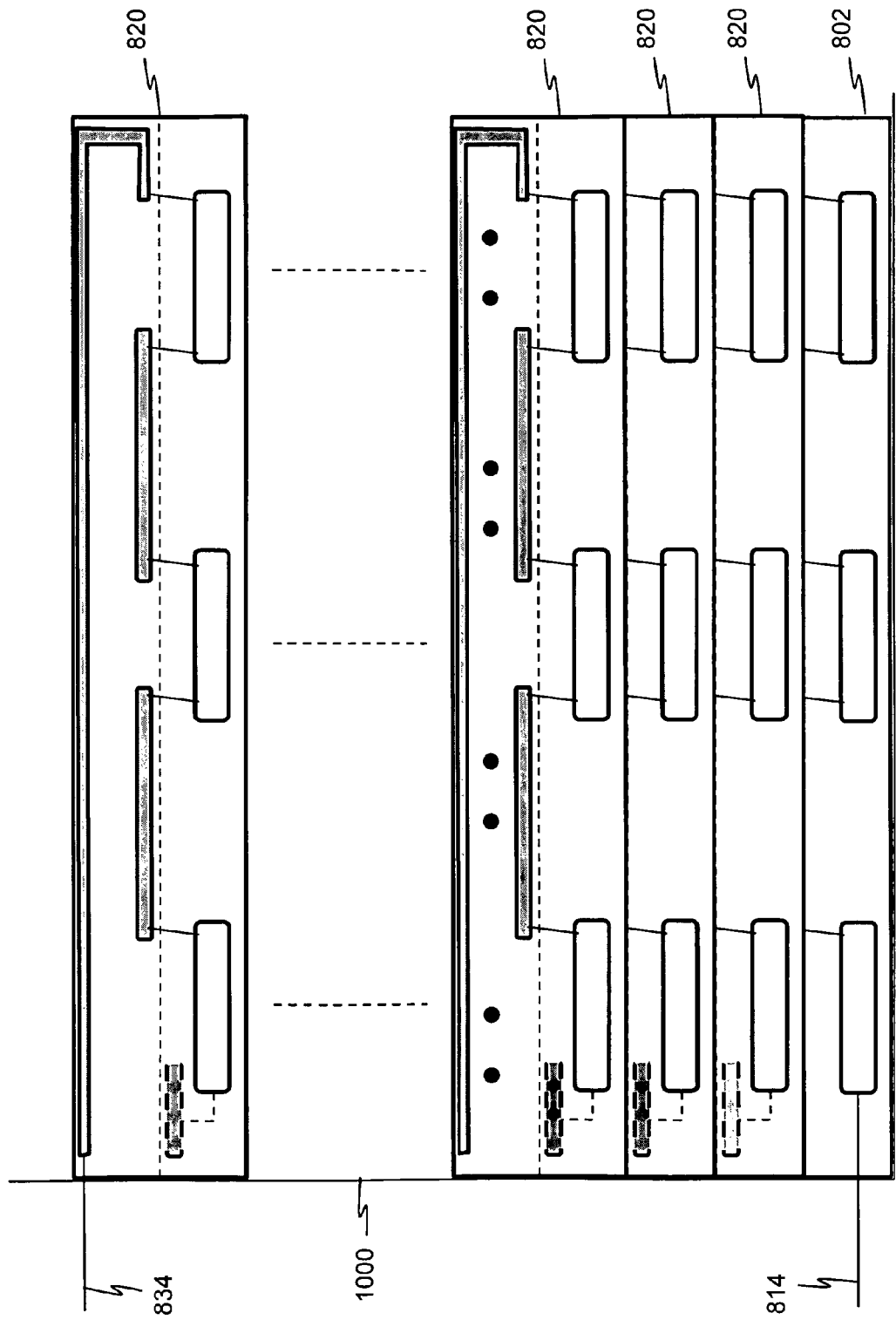
FIG. 9B is a top down view of the base connecting wireless solar panel of FIG. 8A and the connecting wireless solar panel of FIG. 8B being associated with a roof and each other, in accordance with another embodiment.

Referring to FIG. 9A, in one embodiment the wireless solar shingle system 800 may be implemented by positioning a base shingle 802 on the roof 1000 of a structure, such as in bottom corner of the roof 1000, and nailing the base shingle 802 to the roof 1000, as shown. The traces are located at the top and middle portions of the base shingle 802 (and connecting shingles 821) to ensure that the anchoring nails do not contact the traces. A connecting shingle 821 is then associated with the base shingle 802 by positioning the connecting shingle 802 on top of the base shingle 802 to cover a portion of the base shingle 802 such that the connecting trace 842 located on the underside of the connecting shingle 821 is in contact with the third trace 820 of the base shingle 802, taking care not the cover the solar panels 804, 806, 808, as shown in FIG. 9B. The connecting shingle 820 may then be nailed to the roof 1000 and this would be repeated until the roof 1000 was entirely shingled. At this point the solar panels are electrically connected in series fashion, such that when light is incident on the solar panels (having solar cells), a potential difference is generated between the first lead 814 of the solar panel 808 on the base shingle 802 and the second lead 834 of the solar panel 830 on the last connecting shingle 821.

Figure 9C:
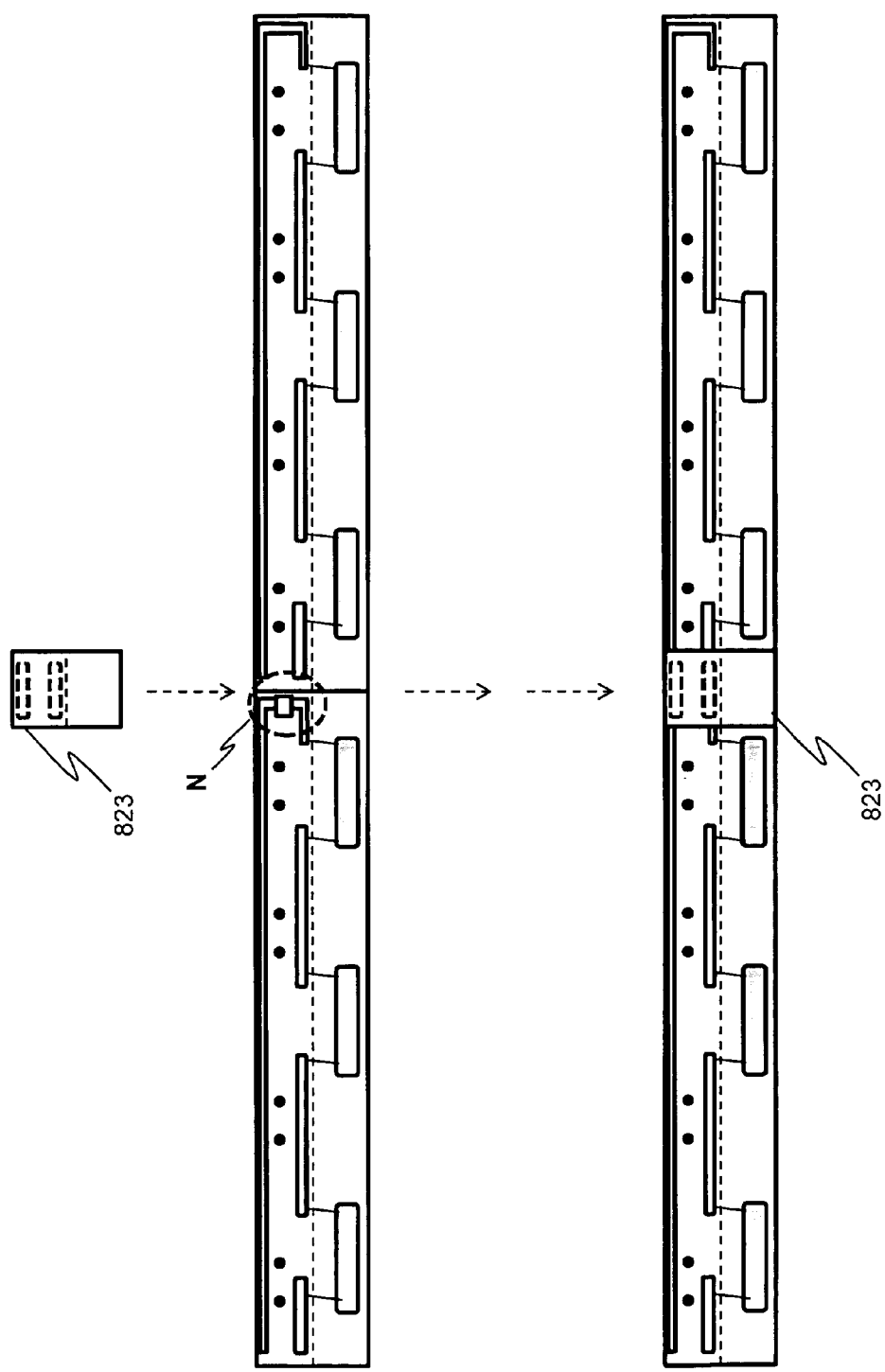
FIG. 9C illustrates one embodiment for connecting adjacent base shingles.
Figure 9D:
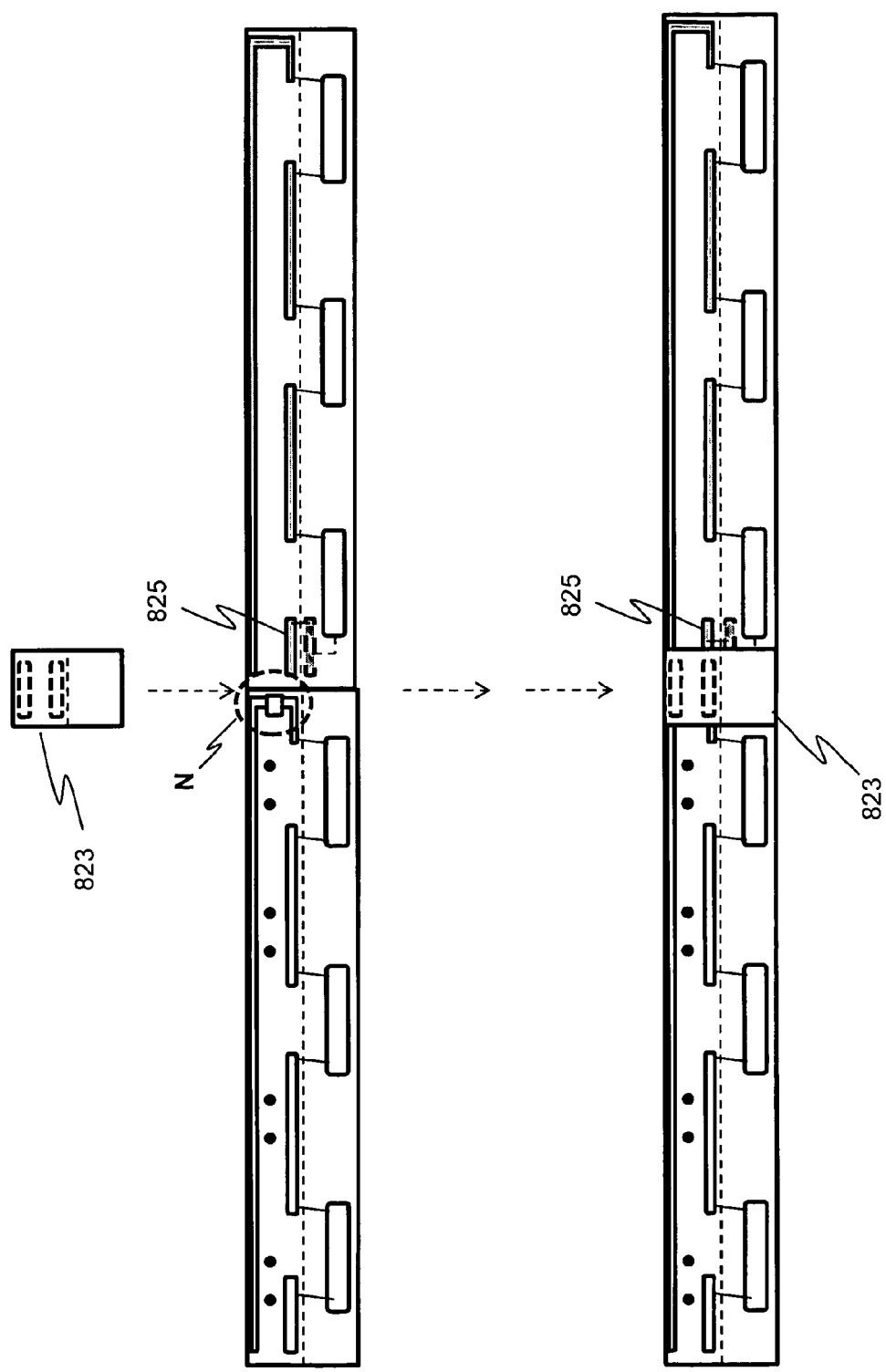
FIG. 9D illustrates one embodiment for connecting a base shingle with a connection shingle positioned adjacent each other.

Referring to FIG. 9C, it is also contemplated that connecting shingle 821 may also connect to adjacent shingles (either base shingle 802 or other connecting shingles 821) to extend across the roof 1000. This may be accomplished by positioning a plurality of base shingles 802 adjacent to each other, removing a portion of the trace 822 as shown in circled portion N, and positioning a jumper shingle 823 to cover adjacent shingles. The jumper shingle 823 has two traces disposed on the bottom to connect trace 822 of one shingle with trace 822 of the adjacent shingle. This can repeated as desired and may be used interchangeably with base shingles and/or connecting shingles, as shown in FIG. 9D. It should be appreciated that an additional trace 825 may be included on the connector shingle to accomplish this task, where the additional trace 825 is electrically connected to first solar panel 826.

Figure 10:
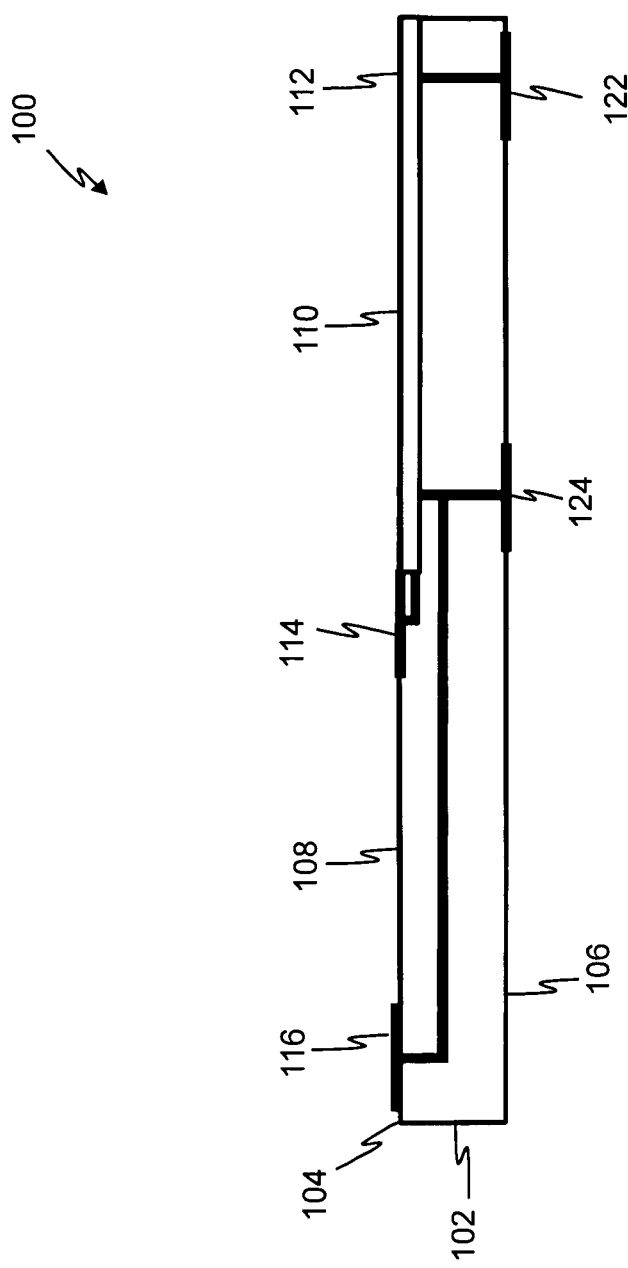
FIG. 10 is a side view of a wireless solar panel in accordance with one embodiment of the present invention.
Figure 11:
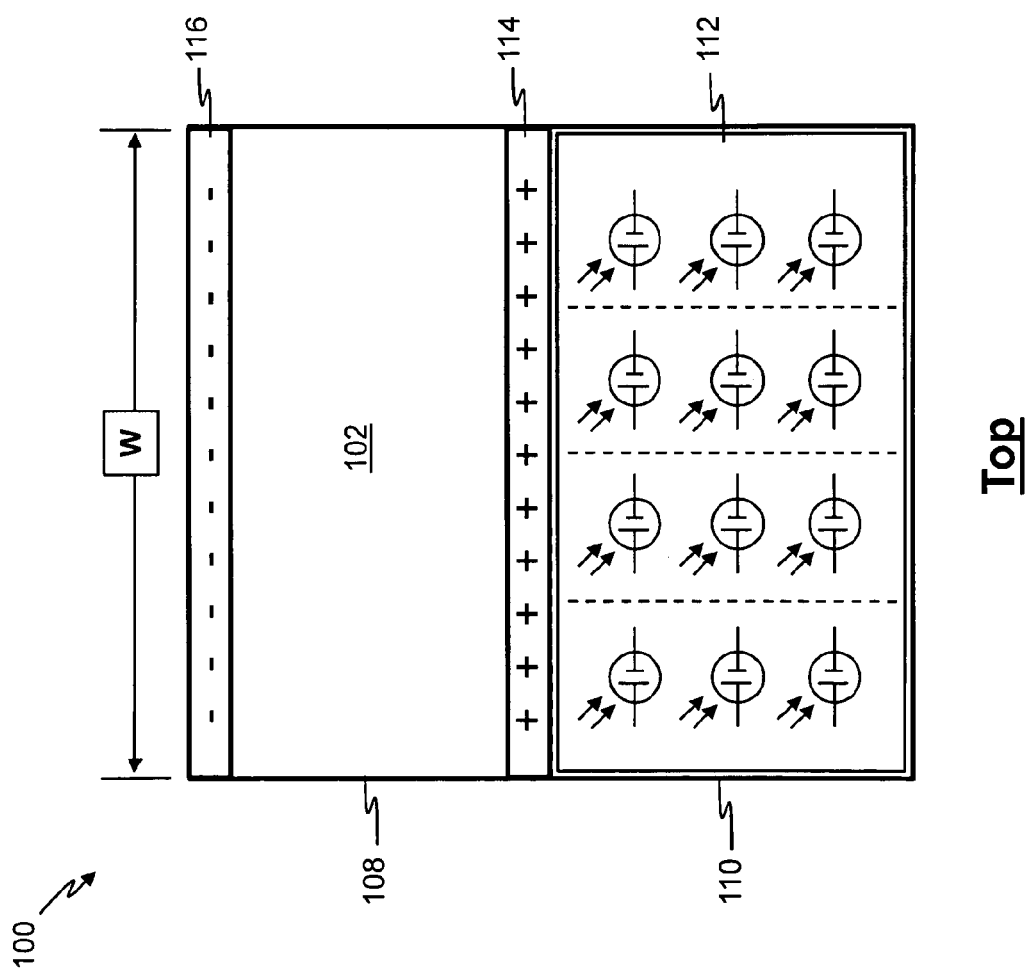
FIG. 11 is a top down view of the wireless solar panel of FIG. 10.
Figure 12:
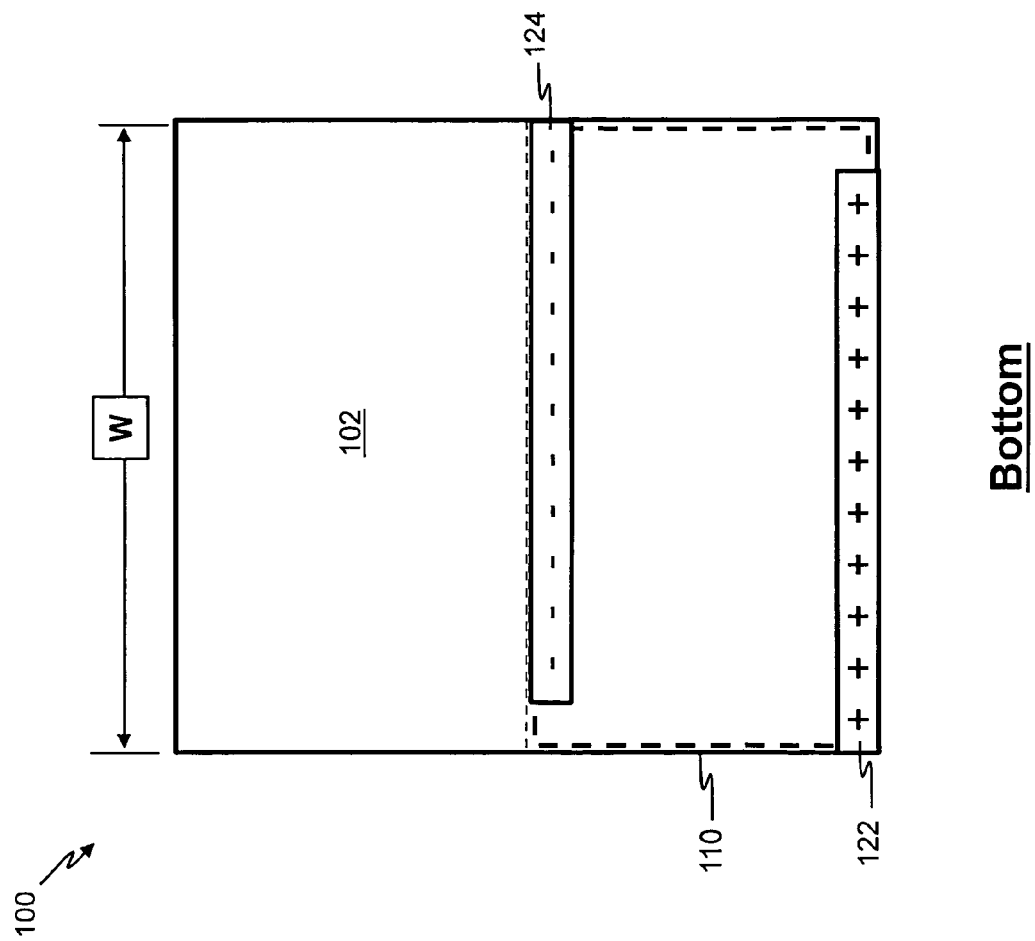
FIG. 12 is a bottom up view of the wireless solar panel of FIG. 10.

Referring to FIG. 10, FIG. 11 and FIG. 12, still yet another embodiment of a wireless solar panel 100 in accordance with the present invention is shown and includes a barrier portion 102 having a top portion 104, a bottom portion 106 and a width W. The top portion 104 includes an interface portion 108 and an energy collection portion 110, wherein the energy collection portion 110 includes at least one solar collection device 112 for capturing and converting solar energy into electrical energy. The barrier portion 102 includes a positive trace 114 and a negative trace 116, wherein the positive trace 114 is connected to the positive lead of the solar collection device 112 and the negative trace 116 is connected to the negative lead of the solar collection device 112. In addition, the bottom portion 106 of the barrier portion 102 includes a positive trace 122 that is connected to the positive lead of the solar collection device 112 and a negative trace 124 that is connected to the negative lead 116 of the solar collection device 112. Moreover, the positive trace 122 and the negative trace 124 are disposed on the bottom layer portion 106 to be below the energy collection portion 110 of the top layer portion 104.

Figure 13:
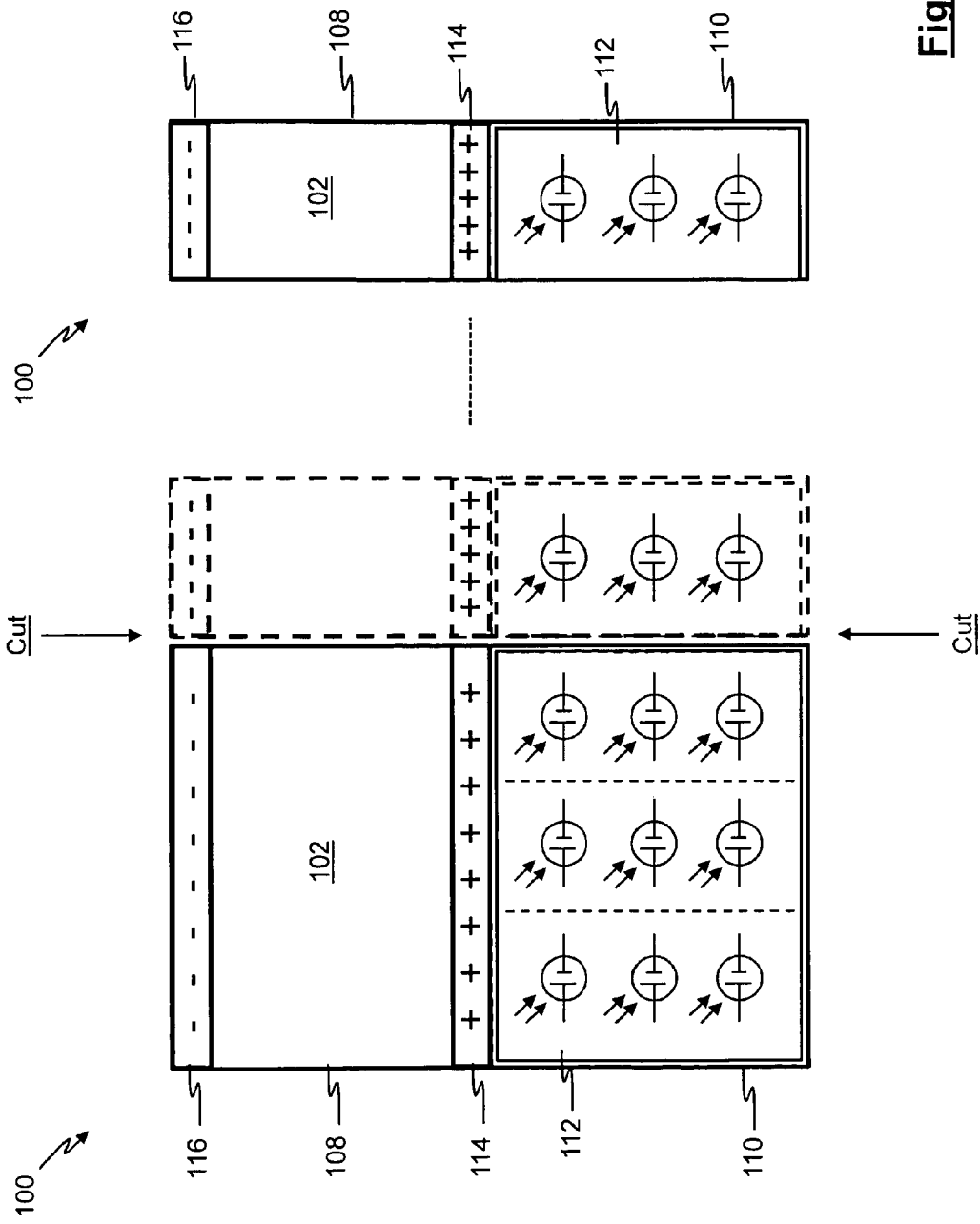
FIG. 13 is a top down view of the wireless solar panel of FIG. 10 illustrating the wireless solar panel being resized, in accordance with the present invention.

In accordance with the present invention and as shown in FIG. 11, the positive trace 114 and the negative trace 116 extends across the width W of the top portion 104 of the wireless solar panel 100. Furthermore, as shown in FIG. 12 the positive trace 122 and the negative trace 124 extends only partially across the width W of the bottom portion 106 of the wireless solar panel 100. However, in an alternative embodiment, the positive traces 114, 122 and the negative traces 116, 124 may only extend completely, partially or piecewise across the width W of the wireless solar panel 100. It should be appreciated that the negative traces 116, 124 may be electrically connected via any method or configuration suitable to the desired end purpose, such as via one or more connections that are disposed within the barrier portion 102, as shown in FIG. 10. Additionally, the positive traces 114, 122 may be electrically connected via any method or configuration suitable to the desired end purpose, such as via one or more connections that are disposed within (integrated or layered on top of) the barrier portion 102. Moreover, it should be appreciated that energy collection portion 110 may include one or more solar collection devices 126 (as indicated by the dotted lines 128 in FIG. 11). This configuration advantageously allows the width W of the wireless solar panel 100 to be adjusted by simply cutting the wireless solar panel 100 along the desired dotted line 128 to fit a desired size. This is illustrated in FIG. 13.

Figure 14:
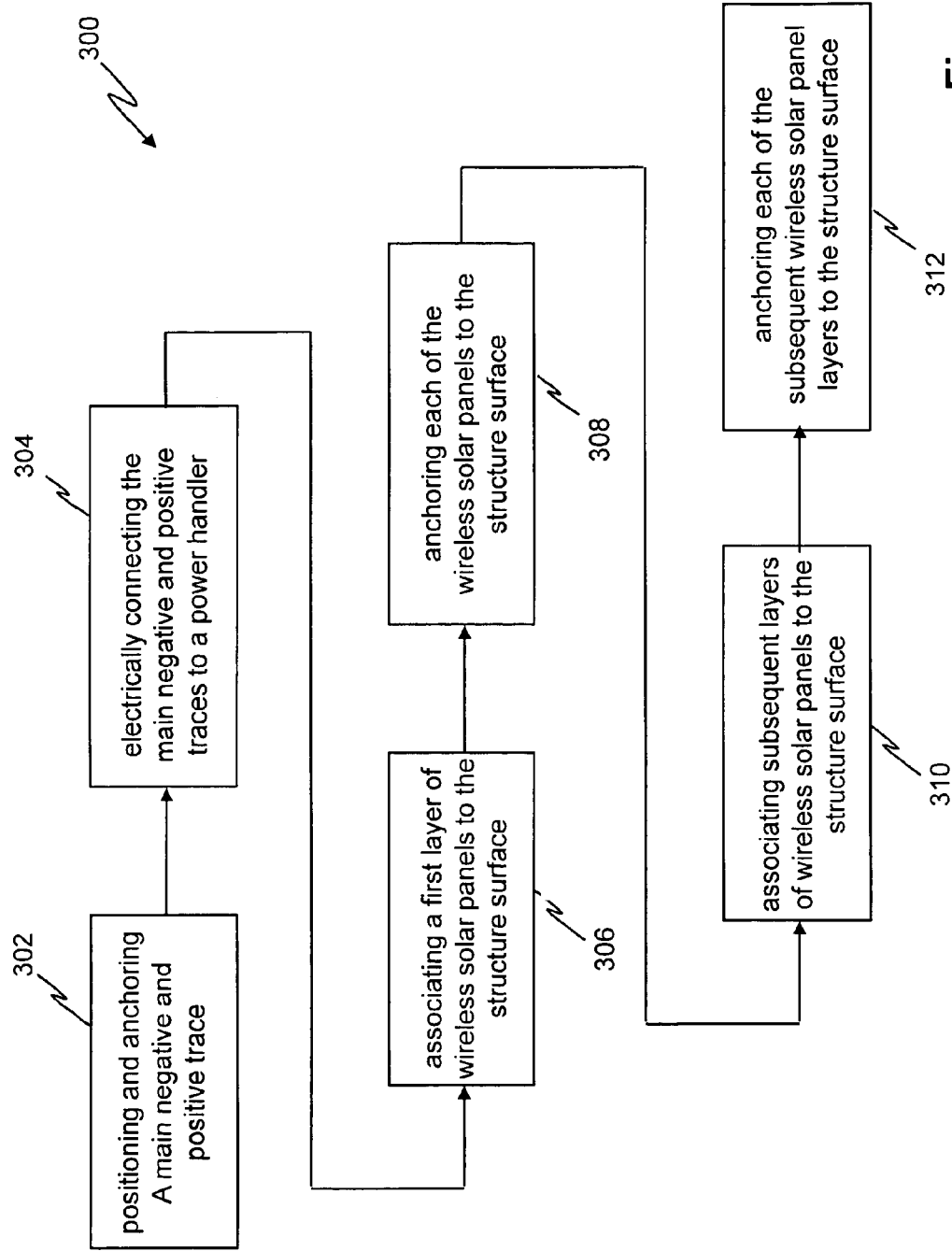
FIG. 14 is a block diagram illustrating a method for implementing the wireless solar panel of FIG. 10, in accordance with the present invention.
Figure 15:
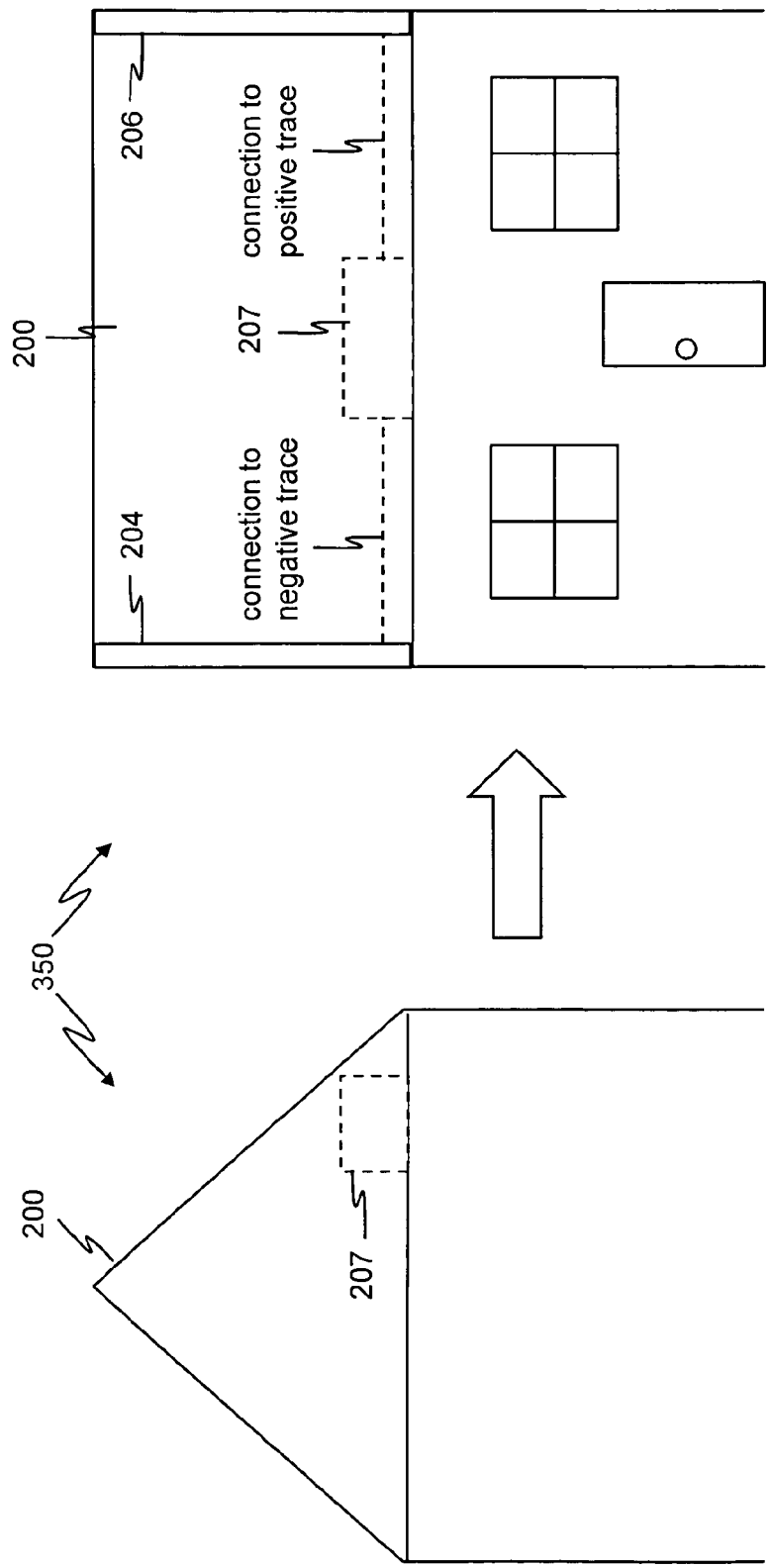
FIG. 15 is a schematic block diagram illustrating a structure for implementing the wireless solar panel of FIG. 10, in accordance with the present invention.

Referring to FIG. 14, a method 300 for implementing the wireless solar panel 100 in accordance with one embodiment of the present invention is illustrated as being applied to one half of the roof 200 of a typical A-Frame structure 350, as shown in FIG. 15. The method 300 includes positioning and anchoring a main negative trace 204 and a main positive trace 206 on opposite sides of the surface of the roof 200, as shown in operational block 302. The method 300 further includes electrically connecting the main negative trace 204 and the main positive trace 206 to a power handler 207 for distributing the power throughout the structure 350 and/or for storage, such as in a power storage unit, as shown in operational block 304 and FIG. 15. It should be appreciated that the positioning of the main negative trace 204 and the main positive trace 206 may be as suitable to the desired end purpose, such as positioning the traces opposite to that shown in FIG. 15.

Figure 16:
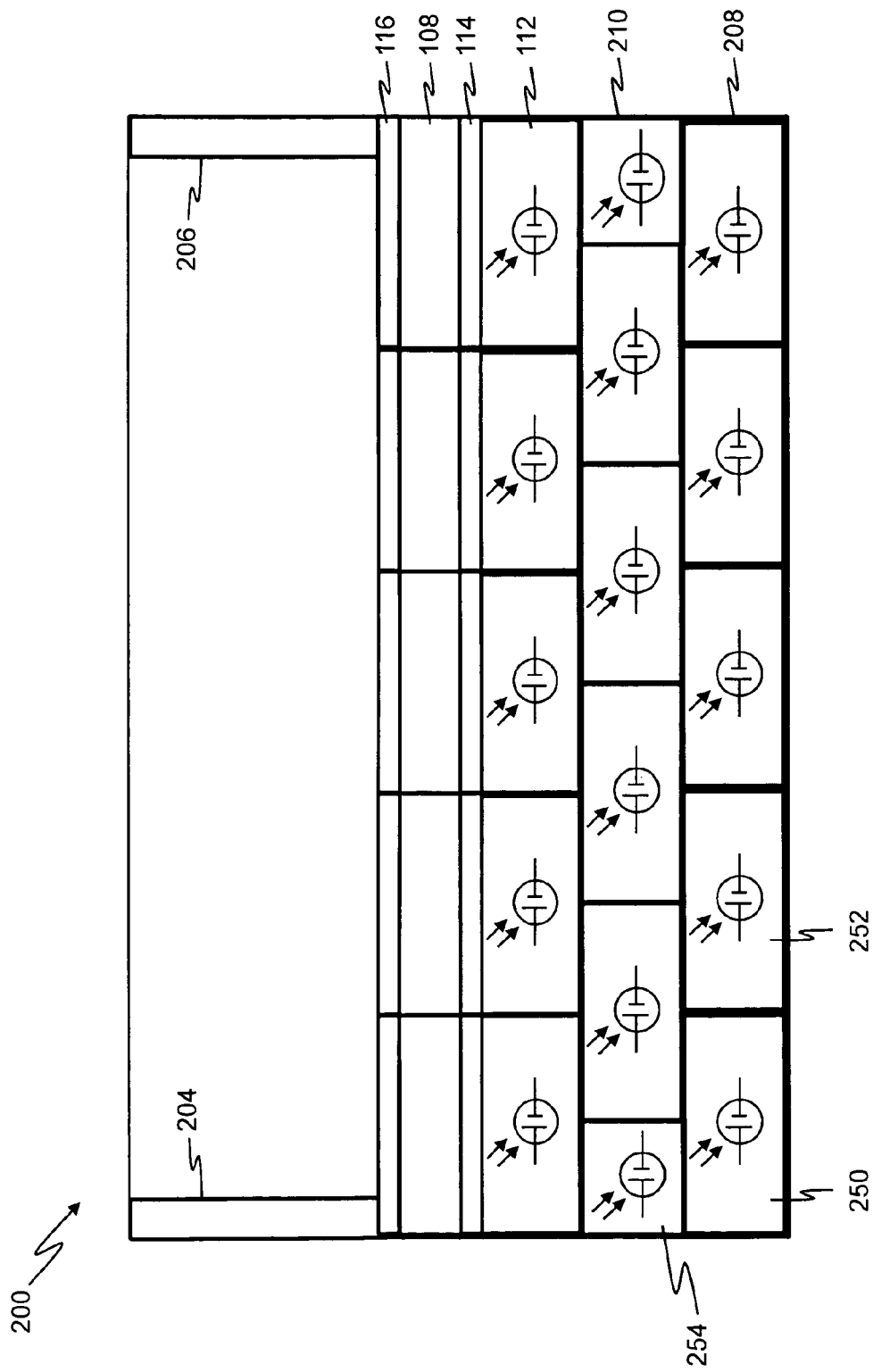
FIG. 16 is a top down view of the roof of the structure of FIG. 15 with the wireless solar panel of FIG. 10 being attached to the roof in an offset pattern, in accordance with the present invention.
Figure 17:
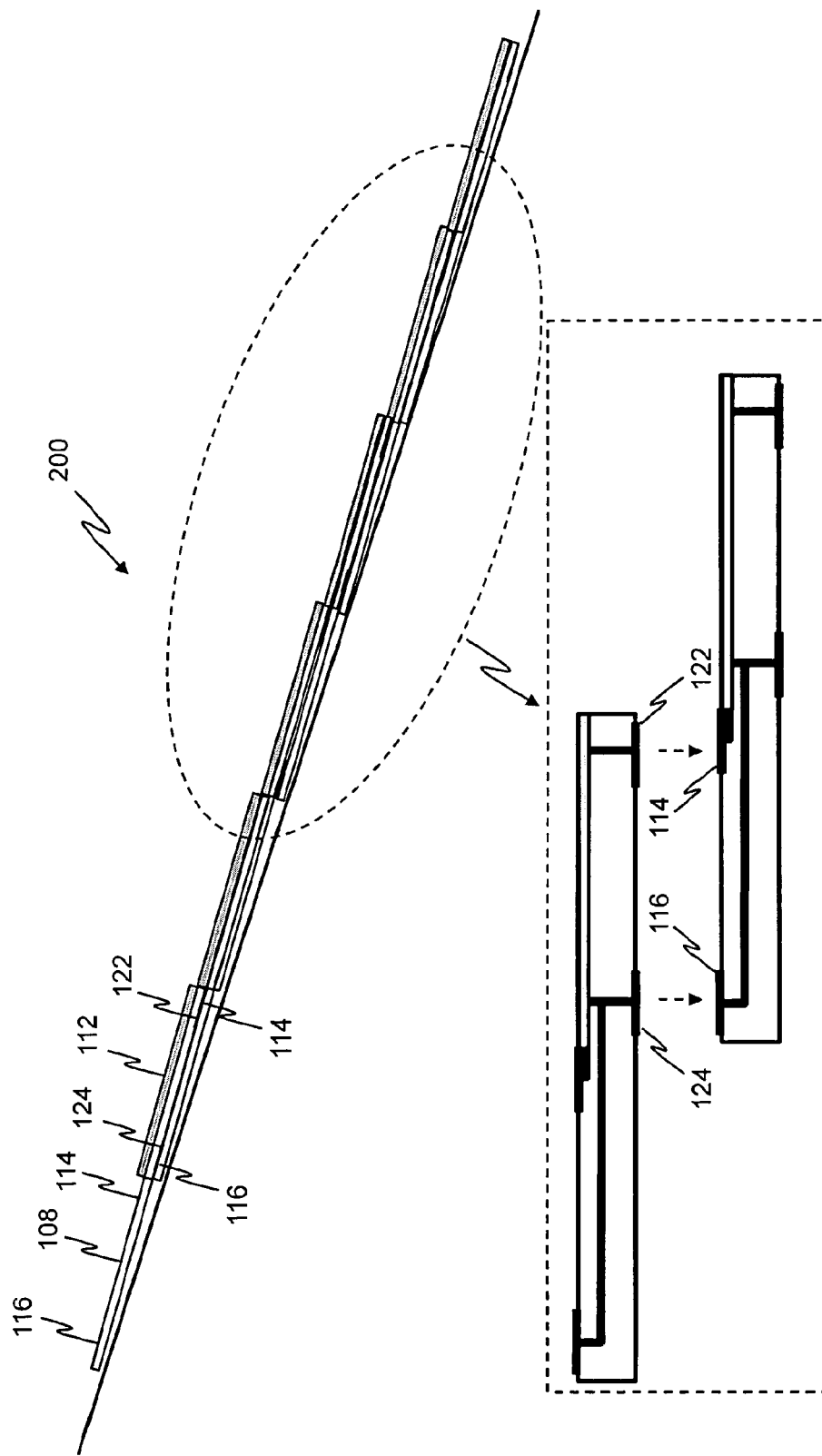
FIG. 17 is a side view of one half of the roof structure of FIG. 15, illustrating the layered pattern of the wireless solar panels of FIG. 16, in accordance with the present invention.

Referring to FIG. 15, FIG. 16 and FIG. 17, a first layer 208 of wireless solar panels 100 is applied to the surface of the roof 200 by positioning a first wireless solar panel 100, 250 on the surface of the roof 200 such that the negative trace 124 (See FIG. 10 and FIG. 12) is in electrical contact with the main negative trace 204, as shown in operational block 306. The first wireless solar panel 100, 250 is then anchored to the surface of the roof 200 via conventional methods, as shown in operational block 308. A second wireless solar panel 100, 252 is then disposed on the surface of the roof 200 to be adjacent the first wireless solar panel 100, 250, wherein the second wireless solar panel 100, 252 is also anchored to the surface of the roof 200 via conventional methods. This is continued until the first layer of wireless solar panels 100 are disposed across the surface of the roof 200, as shown in FIG. 14. It should be appreciated that the last wireless solar panel 100 in the first layer of the wireless solar panels 100 is positioned on the surface of the roof 200 such that the positive trace 122 (See FIG. 10 and FIG. 12) is in electrical contact with the main positive trace 206.

In accordance with the present invention, subsequent layers of wireless solar panels 100 may then be installed on and anchored to the surface of the roof 200 (as needed), as shown in operational block 310 and operational block 312. For example, A second layer 210 of wireless solar panels 100 is then applied in an offset manner to the surface of the roof 200 by positioning a third wireless solar panel 100, 254 on the surface of the roof 200 such that the negative trace 124 (See FIG. 10 and FIG. 12) on the bottom portion 106 of the third wireless solar panel 100, 254 is in electrical contact with the negative trace 116 on the top portion 104 of the first and second wireless solar panels 250, 252 (See FIG. 16). The third wireless solar panel 100, 254 is then anchored to the surface of the roof 200 via conventional methods. The above process should be repeated for each subsequent layer of wireless solar panel layers until the surface of the roof 200 is covered as desired. As illustrated in FIG. 15, it should be appreciated that, each successive layer of wireless solar panels 100 are positioned such that they are offset from the layer of wireless solar panels 100 positioned before them. 'Cut' or shortened wireless solar panels 210 may be used to complete (i.e. fill in the offset portion) the offset layers of wireless solar panels 100. This configuration advantageously allows for an esthetically pleasing layered and offset appearance (See FIG. 14 and FIG. 15) as well as each of the wireless solar panels 100 to be electrically connected to the power handler for future or present use. Accordingly, because the main negative trace 204 and the main positive trace 206 are connected to the power handler prior to installing the wireless solar panels 100, no wire holes are required to be drilled into the roof 200 by the installer.

FIG. 18 illustrates an alternative embodiment 500 of the present invention which includes the main negative trace 502 running along a side and top of the surface of roof 200 and the main positive trace 504 running along a side and bottom of the surface of roof 200. It should be appreciated that the positioning of the main negative trace 502 and the main positive trace 504 may be reversed as desired so that the main negative trace 502 runs along a side and bottom portion of the surface of roof 200 and the main positive trace 504 running along a side and top portion of the surface of roof 200.

In accordance with the present invention, the energy collection portion 110 may be any type of energy collection material(s) and/or device(s) suitable to the desired end purpose, such as devices and/or materials constructed from Copper Indium Gallium Selenide, Cadmium Telluride (CdTe) and Amorphous silicon (a-Si). Moreover, the energy collection portion 110 may be integrated with or connected to the barrier portion 102 of the wireless solar panel 100 as desired. It should be appreciated that in regards to any of the shingles disclosed herein, the traces may be configured (i.e. removed, added (via adhesive, etc.), etc.) as necessary to obtain the desired circuit configuration, be it series, parallel or part series and part parallel. Additionally, conductive traces may be constructed from any material(s) suitable to the desired end purpose, such as Zinc which inhibits the growth of mold. Moreover, the conductive traces may be used in combination with various applications, such as rolled rubber roof membranes, siding, embedding solar cells in asphalt paved roads, asphalt rolled roof membranes, solar jackets, solar sneakers, automobile roof tops, etc.

While the invention has been described with reference to an exemplary embodiment, it will be understood by those skilled in the art that various changes, omissions and/or additions may be made and equivalents may be substituted for elements thereof without departing from the spirit and scope of the invention. In addition, many modifications may be made to adapt a particular situation or material to the teachings of the invention without departing from the scope thereof. Therefore, it is intended that the invention not be limited to the particular embodiment disclosed as the best mode contemplated for carrying out this invention, but that the invention will include all embodiments falling within the scope of the appended claims. Moreover, unless specifically stated any use of the terms first, second, etc. do not denote any order or importance, but rather the terms first, second, etc. are used to distinguish one element from another.

I claim:

1. A shingle configured for installation onto a structure of a building, the shingle comprising:
    a shingle back, said shingle back including at least one back conductive trace; and
    a shingle front configured to securely include at least one solar cell, said shingle front having at least one front conductive trace,
    wherein when said shingle front includes said at least one solar cell, said at least one solar cell is conductively connected to said at least one front conductive trace in a series fashion,
    wherein at least one of said at least one back conductive trace is conductively connected to at least one of said at least one front conductive trace and
    wherein said at least one of said at least one back conductive trace and said at least one of said at least one front conductive trace are configured such that when said shingle is associated with a like shingle, the at least one back conductive trace of said like shingle physically contacts said at least one front conductive trace of said shingle such that said shingle and said like shingle are conductively connected in a series fashion.

2. The shingle of claim 1, wherein when said like shingle is associated with said shingle, said at least one back conductive trace of said like shingle is conductively connected to said at least one front conductive trace of said shingle via a conducting apparatus.

3. The shingle of claim 2, wherein said conducting apparatus is a resilient member.

4. The shingle of claim 2, wherein said at least one front conductive trace, said at least one back conductive trace and said resilient member are constructed from an electrically conductive material.

5. The shingle of claim 1, wherein said at least one front conductive trace and said at least one back conductive trace include a plurality of protruding members such that when said at least one back conductive trace of said like shingle is conductively associated with said at least one front conductive trace of said shingle, said plurality of protruding members of said at least one back conductive trace and said at least one front conductive trace frictionally interact to secure said at least one back conductive trace and said at least one front conductive trace together.

6. The shingle of claim 1, wherein at least a portion of said at least one front conductive trace and said at least one back conductive trace are configured to be removable.

7. The shingle of claim 1, wherein said at least one back conductive trace includes a back conductive trace start and a back conductive trace end and wherein said at least one front conductive trace includes a front conductive trace start and a front conductive trace end.

8. The shingle of claim 7, wherein said front conductive trace end is electrically connected to said back conductive trace start such that said at least one back conductive trace is connected to said at least one front conductive trace in an electrically series fashion.

9. The shingle of claim 1, wherein at least a portion of said at least one front conductive trace is removable to form a gap in said at least one front conductive trace, wherein when said solar cell is connected to said shingle a first electrical lead of said solar cell is connected to said at least one front conductive trace on one side of said gap and a second electrical lead of said solar cell is connected to said at least one front conductive trace on the other side of said gap such that said solar cell is connected to said at least one front conductive trace in a series fashion.

10. A shingle system configured for installation on a roof of a building, the shingle system comprising:
    a plurality of shingles, wherein each of said plurality of shingles includes,
        a shingle back having at least one back conductive trace, and
        a shingle front having at least one front conductive trace, said shingle front being configured to electrically connect at least one solar cell to said at least one front conductive trace in a series fashion, and wherein said shingle back and said shingle front are configured such that when a shingle of said plurality of shingles is associated with a like shingle of said plurality of shingles, said at least one back conductive trace of said like shingle physically contacts said at least one front conductive trace of said shingle such that said shingle and said like shingle are conductively associated with each other in a series fashion.

11. The shingle system of claim 10, wherein when said like shingle is associated with said shingle, said at least one back conductive trace of said like shingle is conductively connected to said at least one front conductive trace of said shingle via a conducting apparatus.

12. The shingle system of claim 11, wherein said conducting apparatus is a resilient member.

13. The shingle system of claim 11, wherein said at least one front conductive trace, said at least one back conductive trace and said resilient member are constructed from an electrically conductive material.

14. The shingle system of claim 10, wherein said at least one front conductive trace and said at least one back conductive trace include a plurality of protruding members such that when said at least one back conductive trace of said like shingle is conductively associated with said at least one front conductive trace of said shingle, said plurality of protruding members of said at least one back conductive trace and said at least one front conductive trace frictionally interact to secure said at least one back conductive trace and said at least one front conductive trace together.

15. The shingle system of claim 10, wherein at least a portion of said at least one front conductive trace and said at least one back conductive trace are configured to be removable.

16. The shingle system of claim 10, wherein said at least one back conductive trace includes a back conductive trace start and a back conductive trace end and wherein said at least one front conductive trace includes a front conductive trace start and a front conductive trace end.

17. The shingle system of claim 16, wherein said front conductive trace end is electrically connected to said back conductive trace start such that said at least one back conductive trace is connected to said at least one front conductive trace in an electrically series fashion.

18. The shingle system of claim 10, wherein at least a portion of said at least one front conductive trace is removable to form a gap in said at least one front conductive trace, wherein when said solar cell is connected to said shingle a first electrical lead of said solar cell is connected to said at least one front conductive trace on one side of said gap and a second electrical lead of said solar cell is connected to said at least one front conductive trace on the other side of said gap such that said solar cell is connected to said at least one front conductive trace in a series fashion.

19. A method for implementing a wireless solar shingle system, the wireless solar shingle system including shingles having a shingle back which includes at least one back conductive trace, and a shingle front having at least one front conductive trace, the shingle front being configurable to electrically connect at least one solar cell to the at least one front conductive trace in an electrically series fashion, the method comprising:

positioning a plurality of first layer shingles on a structure surface to form a first layer;

anchoring said plurality of first layer shingles to said structure surface such that each of said plurality of first layer shingles are electrically connected to adjacent first layer shingles in series fashion via at least one of said at least one front conductive trace and said at least one back conductive trace;

positioning a plurality of second layer shingles on said structure surface to form a second layer; and anchoring said plurality of second layer shingles to said structure surface such that said plurality of second layer shingles are electrically connected to said adjacent second layer shingles and said first layer in series fashion via at least one of said at least one front conductive trace and said at least one back conductive trace.

20. A method for fabricating a wireless solar shingle, wherein the wireless solar shingle includes a shingle front and a shingle back, the shingle back including at least one back conductive trace and the shingle front configured to securely include at least one solar cell, the shingle front having at least one front conductive trace, wherein the at least one front conductive trace is configurable such that when the shingle front includes the at least one solar cell, the at least one solar cell is conductively connected to the at least one front conductive trace in a series fashion, wherein at least one of the at least one back conductive trace is conductively connected to at least one of the at least one front conductive trace and wherein at least one of the at least one back conductive trace and the at least one of the at least one front conductive trace are configured such that when the shingle is associated with a like shingle, the at least one back conductive trace of the like shingle is conductively connected to the at least one front conductive trace in a series fashion, the method comprising:

depositing an electrically conductive material on said shingle front to form a front trace, wherein said front trace includes a front trace start and a front trace end;

depositing an electrically conductive material on said shingle back to form a back trace, wherein said back trace includes a back trace start and a back trace end; and connecting said back trace start with said front trace end such that said back trace end is connected with said front trace start via a series connection.

* * * * *